(12) United States Patent
Kung et al.

(10) Patent No.: US 11,854,872 B2
(45) Date of Patent: Dec. 26, 2023

(54) SEMICONDUCTOR DEVICE STRUCTURE WITH INTERCONNECT STRUCTURE AND METHOD FOR FORMING THE SAME

(71) Applicant: Taiwan Semiconductor Manufacturing Co., Ltd., Hsinchu (TW)

(72) Inventors: Chun-Hao Kung, Hsinchu (TW); Chih-Chieh Chang, Zhubei (TW); Kao-Feng Liao, Hsinchu (TW); Hui-Chi Huang, Zhubei (TW); Kei-Wei Chen, Tainan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 8 days.

(21) Appl. No.: 17/869,560

(22) Filed: Jul. 20, 2022

(65) Prior Publication Data
US 2022/0367257 A1   Nov. 17, 2022

Related U.S. Application Data

(63) Continuation of application No. 16/382,641, filed on Apr. 12, 2019, now Pat. No. 11,417,566.

(60) Provisional application No. 62/712,335, filed on Jul. 31, 2018.

(51) Int. Cl.
| | |
|---|---|
| *H01L 21/768* | (2006.01) |
| *H01L 29/66* | (2006.01) |
| *H01L 21/02* | (2006.01) |

(52) U.S. Cl.
CPC .... *H01L 21/76831* (2013.01); *H01L 21/7684* (2013.01); *H01L 21/76814* (2013.01); *H01L 21/76877* (2013.01); *H01L 21/02211* (2013.01); *H01L 21/76843* (2013.01); *H01L 29/66795* (2013.01)

(58) Field of Classification Search
CPC ......... H01L 21/76831; H01L 21/76814; H01L 21/7684; H01L 21/76877; H01L 29/66795; H01L 21/76843; H01L 21/02211; H01L 21/76847; H01L 21/76826; H01L 21/3105; H01L 21/76804; H01L 21/76816; H01L 21/76879; H01L 21/76895; H01L 23/5226; H01L 23/5283
See application file for complete search history.

(56) References Cited

U.S. PATENT DOCUMENTS

| | | | |
|---|---|---|---|
| 6,508,953 B1 * | 1/2003 | Li | C23F 3/00 438/692 |
| 6,528,426 B1 * | 3/2003 | Olsen | H01L 21/3212 438/689 |
| 2005/0032293 A1 * | 2/2005 | Clark | H01L 21/02337 257/E21.228 |

(Continued)

*Primary Examiner* — Ermias T Woldegeorgis
(74) *Attorney, Agent, or Firm* — Slater Matsil, LLP

(57) ABSTRACT

A method for forming a semiconductor device structure is provided. The method includes forming a first metal layer over a substrate, forming a dielectric layer over the first metal layer. The method includes forming a trench in the dielectric layer, and performing a surface treatment process on a sidewall surface of the trench to form a hydrophobic layer. The hydrophobic layer is formed on a sidewall surface of the dielectric layer. The method further includes depositing a metal material in the trench and over the hydrophobic layer to form a via structure.

20 Claims, 19 Drawing Sheets

(56) References Cited

U.S. PATENT DOCUMENTS

| | | | |
|---|---|---|---|
| 2010/0122711 A1* | 5/2010 | Ryan | H01L 21/02063 438/758 |
| 2010/0237501 A1* | 9/2010 | Tomizawa | H01L 21/76832 257/E21.585 |
| 2010/0248473 A1* | 9/2010 | Ishizaka | H01L 21/76883 257/E21.582 |
| 2014/0191400 A1* | 7/2014 | Chien | H01L 23/53295 438/653 |
| 2018/0100086 A1 | 4/2018 | Mahulikar | |

* cited by examiner

SEMICONDUCTOR DEVICE STRUCTURE WITH INTERCONNECT STRUCTURE AND METHOD FOR FORMING THE SAME

PRIORITY CLAIM AND CROSS-REFERENCE

This application is a continuation of U.S. application Ser. No. 16/382,641, filed on Apr. 12, 2019, entitled "Semiconductor Device Structure with Interconnect Structure and Method for Forming the Same," which application claims priority to and the benefit of U.S. Provisional Application No. 62/712,335, filed on Jul. 31, 2018, entitled "A Hydrophobic Layer Insertion on Sidewall to Resist Underlayer Metal Loss," which applications are hereby incorporated herein by reference.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

In the fabrication of semiconductor devices, the size of semiconductor devices has been continuously reduced in order to increase device density. Accordingly, a multi-layered interconnect structure is provided. The interconnect structure includes a conductive feature embedded in a dielectric material.

Although existing interconnect structures with dielectric layers have been generally adequate for their intended purpose, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 1F' shows a cross-sectional representation of a semiconductor device structure, in accordance with some embodiments of the disclosure.

FIG. 5E' shows a cross-sectional representation of a semiconductor device structure, in accordance with some embodiments of the disclosure.

FIG. 8E' shows a cross-sectional representation of a semiconductor device structure, in accordance with some embodiments of the disclosure.

DETAILED DESCRIPTION

Figure 1A:
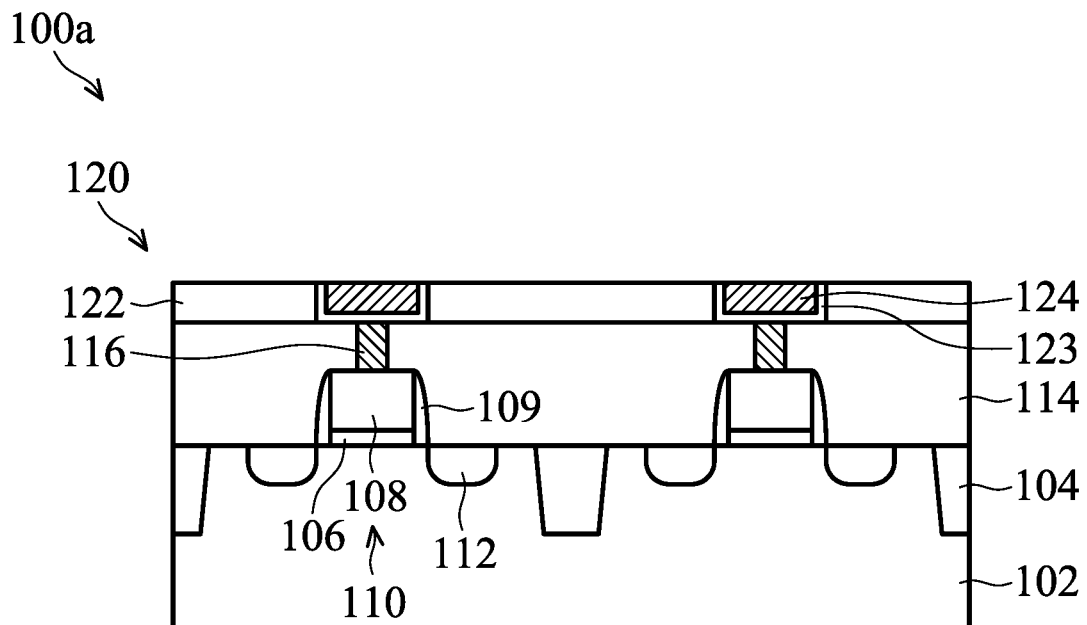
FIGS. 1A-1F show cross-sectional representations of various stages of forming a semiconductor device structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Embodiments for a semiconductor device structure and method for forming the same are provided. FIGS. 1A-1F show cross-sectional representations of various stages of forming a semiconductor device structure 100a, in accordance with some embodiments of the disclosure. FIG. 2 shows a flow chart of a method for forming a semiconductor device structure 100a, 100b, 100c, 100d, 100e, 200a, 200b, in accordance with some embodiments of the disclosure. The semiconductor device structure 100 includes an interconnect structure, and the interconnect structure includes a metal layer and a via structure formed over the metal layer. A hydrophobic layer is formed on sidewall surfaces of the via structure. The interconnect structure can be applied to a planar device, a FinFET structure, a nanowire structure or other device.

Figure 2:
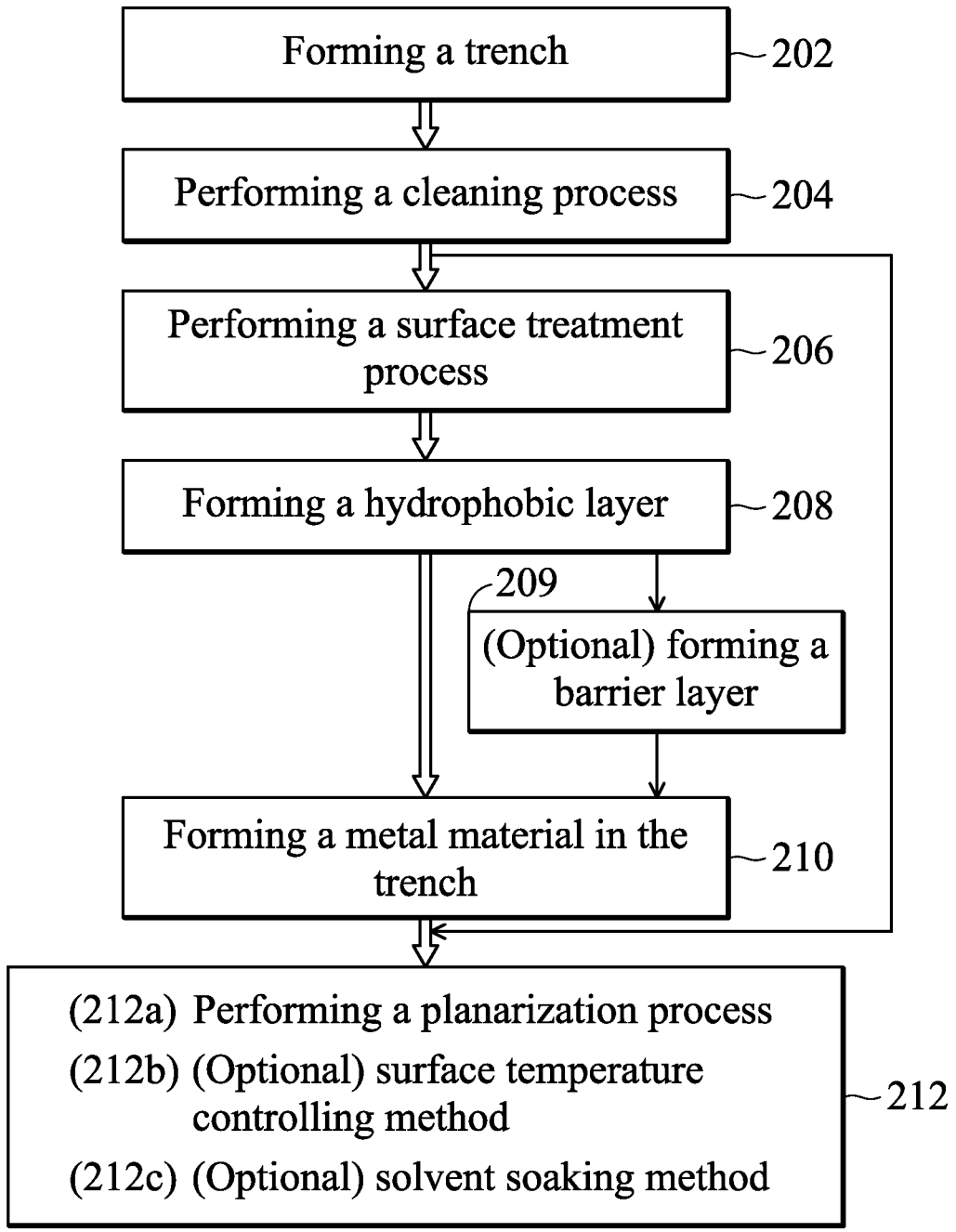
FIG. 2 shows a flow chart of a method for forming a semiconductor device structure, in accordance with some embodiments of the disclosure.

Referring to FIG. 1A, the semiconductor device structure 100a includes a substrate 102. In some embodiments, the substrate 102 is a portion of a wafer. The substrate 102 may be made of silicon or other semiconductor materials. Alternatively or additionally, the substrate 102 may include other elementary semiconductor materials such as germanium. In some embodiments, the substrate 102 is made of a compound semiconductor such as silicon carbide, gallium arsenic, indium arsenide, or indium phosphide. In some embodiments, the substrate 102 is made of an alloy semiconductor such as silicon germanium, silicon germanium carbide, gallium arsenic phosphide, or gallium indium phosphide. In some embodiments, the substrate 102 includes an epitaxial layer. For example, the substrate 102 has an epitaxial layer overlying a bulk semiconductor.

The substrate 102 may further include isolation structure 104, such as shallow trench isolation (STI) features or local oxidation of silicon (LOCOS) features. Isolation features may define and isolate various device elements.

The substrate 102 may further include doped regions (not shown). The doped regions may be doped with p-type dopants, such as boron or $BF_2$, and/or n-type dopants, such as phosphorus (P) or arsenic (As). The doped regions may be formed directly on the substrate 102, in a P-well structure, in an N-well structure, or in a dual-well structure.

A transistor device 110 including a gate dielectric layer 106 and a gate electrode layer 108 is formed over the substrate 102. The spacers 109 are formed on opposite sidewalls of the gate electrode layer 108. The source/drain (S/D) structures 112 are formed in the substrate 102.

Other device elements include transistors (e.g., metal oxide semiconductor field effect transistors (MOSFET), complementary metal oxide semiconductor (CMOS) transistors, bipolar junction transistors (BJT), high-voltage transistors, high-frequency transistors, p-channel and/or n channel field effect transistors (PFETs/NFETs), etc.), diodes, and/or other applicable elements may formed over the substrate 102. Various processes are performed to form device elements, such as deposition, etching, implantation, photolithography, annealing, and/or other applicable processes. In some embodiments, device elements are formed in the substrate 102 in a front-end-of-line (FEOL) process.

Afterwards, an inter-layer dielectric (ILD) layer 114 is formed over the substrate 102, as shown in FIG. 1A, in accordance with some embodiments of the disclosure. The ILD layer 114 may include multilayers. The ILD layer 114 is made of silicon oxide (SiOx), silicon nitride (SixNy), silicon oxynitride (SiON) or low-k dielectric material, another applicable dielectric material.

A contact structure 116 is formed in the ILD layer 114 and over the transistor device 110. The contact structure 116 is made of conductive material, such as such as copper (Cu), copper alloy, aluminum (Al), aluminum alloy, tungsten (W), tungsten alloy, titanium (Ti), titanium alloy, tantalum (Ta), tantalum alloy, or another applicable materials.

An interconnect structure 120 is formed over the ILD layer 114. The interconnect structure 120 includes a first dielectric layer 122 (or called as inter-metal dielectric (IMD) layer), a first metal layer 124 and a barrier layer 123. The first metal layer 124 and the barrier layer 123 are formed in the first dielectric layer 122. The first metal layer 124 is electrically connected to the transistor device 110 by the contact structure 116. The interconnect structure 120 is formed in a back-end-of-line (BEOL) process.

The first dielectric layer 122 may be a single layer or multiple layers. The first dielectric layer 122 is made of silicon oxide (SiOx), silicon nitride (SixNy), silicon oxynitride (SiON), dielectric material(s) with low dielectric constant (low-k), or combinations thereof. In some embodiments, the first dielectric layer 122 is made of an extreme low-k (ELK) dielectric material with a dielectric constant (k) less than about 2.5. In some embodiments, ELK dielectric materials include carbon doped silicon oxide, amorphous fluorinated carbon, parylene, bis-benzocyclobutenes (BCB), polytetrafluoroethylene (PTFE) (Teflon), or silicon oxycarbide polymers (SiOC). In some embodiments, ELK dielectric materials include a porous version of an existing dielectric material, such as hydrogen silsesquioxane (HSQ), porous methyl silsesquioxane (MSQ), porous polyarylether (PAE), porous SiLK, or porous silicon oxide ($SiO_2$). In some embodiments, the first dielectric layer 122 is deposited by a plasma enhanced chemical vapor deposition (PECVD) process or by a spin coating process.

In some embodiments, the barrier layer 123 is made of tantalum (Ta), tantalum nitride (TaN), titanium (Ti), titanium nitride (TiN), cobalt tungsten (CoW) or another applicable material. In some embodiments, the barrier layer 123 is formed by an electroplating, electroless plating, printing, chemical vapor deposition (CVD) process or physical vapor deposition (PVD) process.

The first metal layer 124 is made of tungsten (W), cobalt (Co), copper (Cu), ruthenium (Ru), zirconium (Zr), hafnium (Hf), tantalum (Ta), aluminum (Al), or a combination thereof. In some embodiments, the first metal layer 124 is formed by an electroplating, electroless plating, printing, chemical vapor deposition (CVD) process or physical vapor deposition (PVD) process.

As shown in FIG. 1A, a top surface of the first metal layer 124 is substantially level with a top surface of the first dielectric layer 122. In other words, top surfaces of the first metal layer 124 and the first dielectric layer 122 are substantially coplanar. The metal routings of the conductive features shown in FIG. 1A, are merely examples. Alternatively, other designs of metal routings of conductive features may be used according to actual application.

Figure 1B:
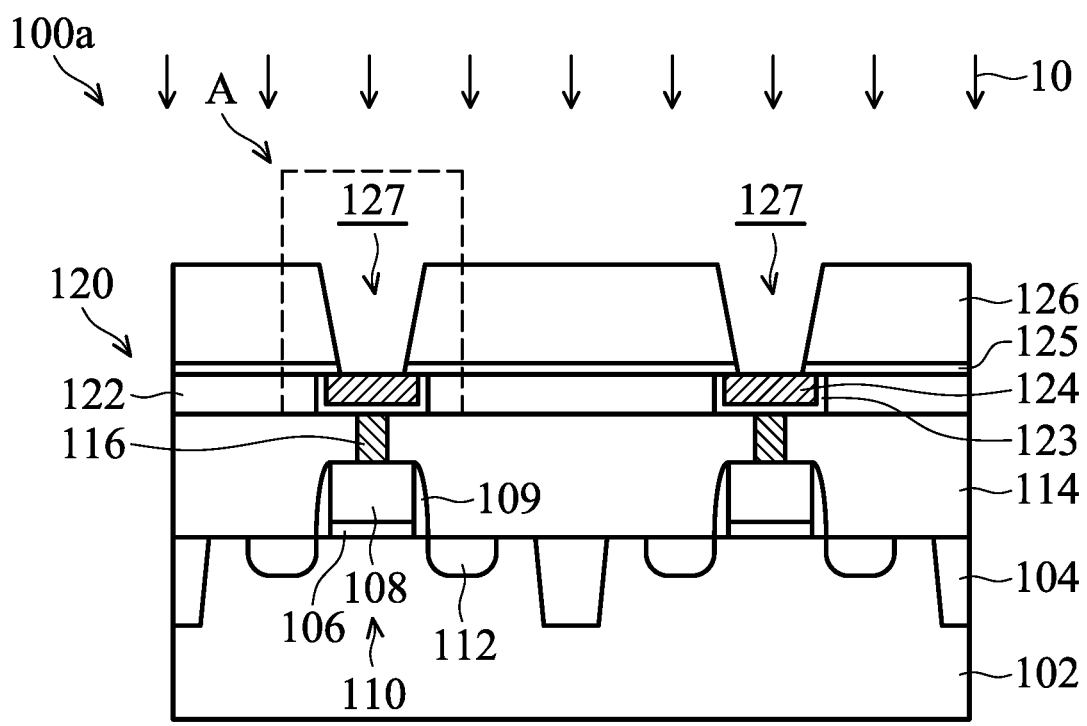

Afterwards, as shown in FIG. 1B, an etching stop layer 125 and a second dielectric layer 126 are sequentially formed over the first dielectric layer 122, in accordance with some embodiments of the disclosure.

In some embodiments, the etching stop layer 125 is made of silicon carbide (SiC), silicon nitride (SixNy), silicon carbonitride (SiCN), silicon oxycarbide (SiOC), silicon oxycarbon nitride (SiOCN), or another applicable material. In some embodiments, the etching stop layer 125 is formed by performing a deposition process, such as an atomic layer deposition (ALD) process, a chemical vapor deposition (CVD) process, a physical vapor deposition (PVD) process, or another applicable process.

Afterwards, as shown in FIG. 1B and step 202 of FIG. 2, a portion of the second dielectric layer 126 and a portion of the etching stop layer 125 are removed to form a trench 127, and therefore the top surface of the first metal layer 124 is exposed. In some embodiments, the portion of the second dielectric layer 126 and the portion of the etching stop layer 125 are removed by an etching process.

Next, as shown in FIG. 1B and step 204 of FIG. 2, a cleaning process 10 is performed on the trench 127. The cleaning process 10 is used to remove the remaining materials generated from the etching process. In some embodiments, the cleaning process includes a wet cleaning process. In some embodiments, the cleaning solution used in the cleaning process 10 includes using water solution.

Figure 3A:
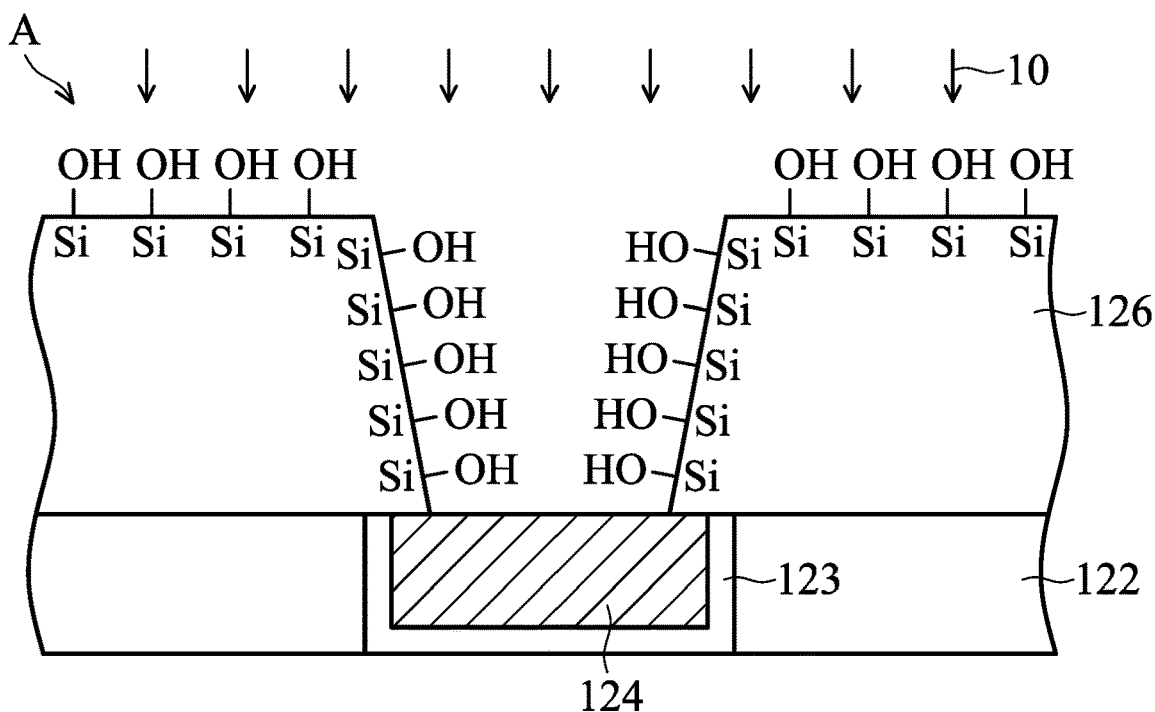
FIG. 3A shows an enlarged representation of region A of FIG. 1B, in accordance with some embodiments of the disclosure.

FIG. 3A shows an enlarged representation of region A of FIG. 1B, in accordance with some embodiments of the disclosure. Since the cleaning solution contains water and the second dielectric layer 126 includes silicon (Si), the sidewall surfaces of the trench 127 may include —OH group. As shown in FIG. 3A, the sidewall surfaces of the trench 127 include dangling bonds, —OH groups.

Figure 1C:
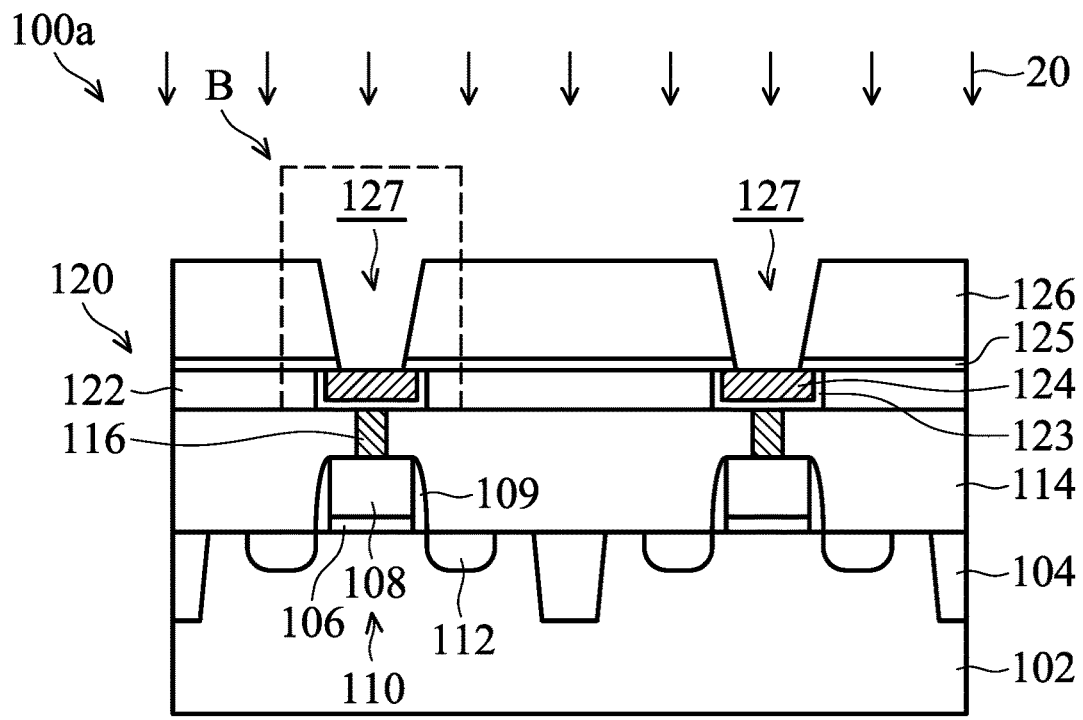

Afterwards, as shown in FIG. 1C and step 206 of FIG. 2, a first surface treatment process 20 is performed on the trench 127 and second dielectric layer 126, in accordance with some embodiments of the disclosure. The first surface treatment process 20 is used to make the sidewall surfaces of the trench 127 become more hydrophobic. As a result, a hydrophobic layer 130 (shown in FIG. 1D) is formed.

In some embodiments, the first surface treatment process 20 includes providing a gas mixture on the sidewall surfaces of the trench 127. The gas mixture includes a silane compound and a carrier gas. The gas mixture may include one type or multiple types of silane compounds.

In some embodiments, the silane compound has a formula (I):

R—Si—X    (I), wherein R is an organofunctional group, X is hydrolyzable group, and the organofunctional group is an aromatic functional group, an amino acid functional group or a fluorine functional group.

In some embodiments, the silane compound includes trialkoxysilane, dialkoxysilane, monoalkozysilane, dipodal silane or another applicable material.

In some embodiments, the silane compound is 3-(4-pyridylethyl) thiopropyltrimethoxy silane having a formula (II). This compound has an aromatic functional group.

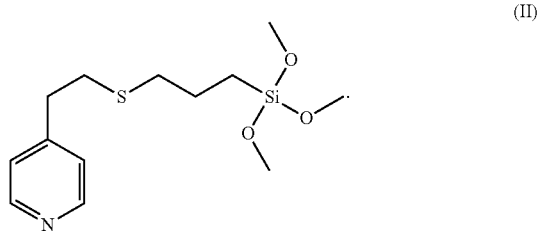 [SMILES: CO[Si](CCCSCCc1ccncc1)(OC)OC]

(II)

In some embodiments, the silane compound is N-(N-acetylleucyl)-3-aminopropyltriethoxy silane having a formula (III).

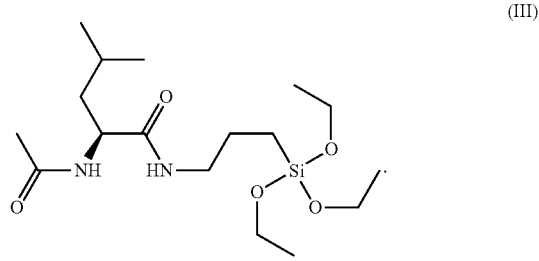 [SMILES: CCO[Si](CCCNC(=O)[C@H](CC(C)C)NC(C)=O)(OCC)OCC]

(III)

In some embodiments, the silane compound is trimethoxysilane having a formula (IV).

(IV)

In some embodiments, the silane compound is aminopropyl dimethyl ethoxysilane having a formula (V).

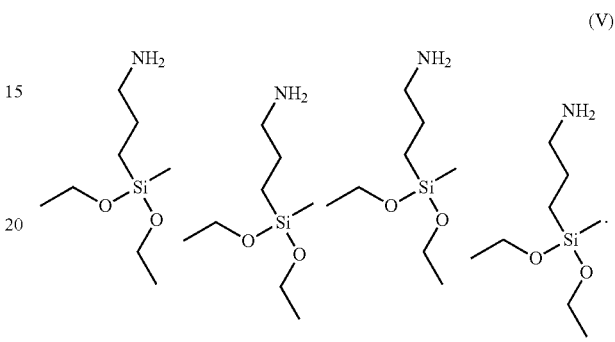

(V)

In some embodiments, the silane compound is aminopropyl methyl diethoxysilane having a formula (VI).

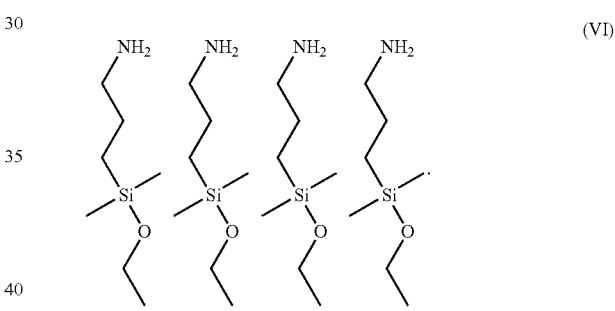

(VI)

In some embodiments, the silane compound is 1,2-Bis(trimethoxysilyl)decane having a formula (VII).

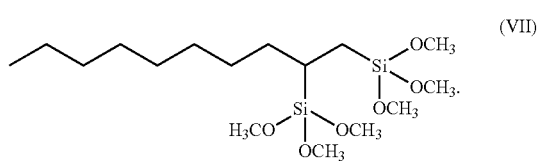 [SMILES: CCCCCCCCC(C[Si](OC)(OC)OC)[Si](OC)(OC)OC]

(VII)

In some embodiments, the silane compound is (tridecafluoro-1,1,2,2-tetrahydrooctyl) silane having a formula (VIII).

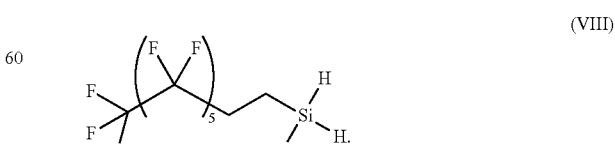

(VIII)

In some embodiments, the carrier gas includes helium (He), neon (Ne), argon (Ar), krypton (Kr), nitrogen ($N_2$) or a combination thereof. In some embodiments, a ratio of the silane compound to the gas mixture is in a range from about 50 volume % to about 80 volume %. In some embodiments, the first surface treatment process 20 is operated at a pressure in a range from about $10^{-6}$ torr to about $10^{-8}$ torr. When the pressure of the first surface treatment process 20 is within the above-mentioned range, the silane compound can be modified on the sidewall surfaces of the trench 127 more effectively.

Figure 3B:
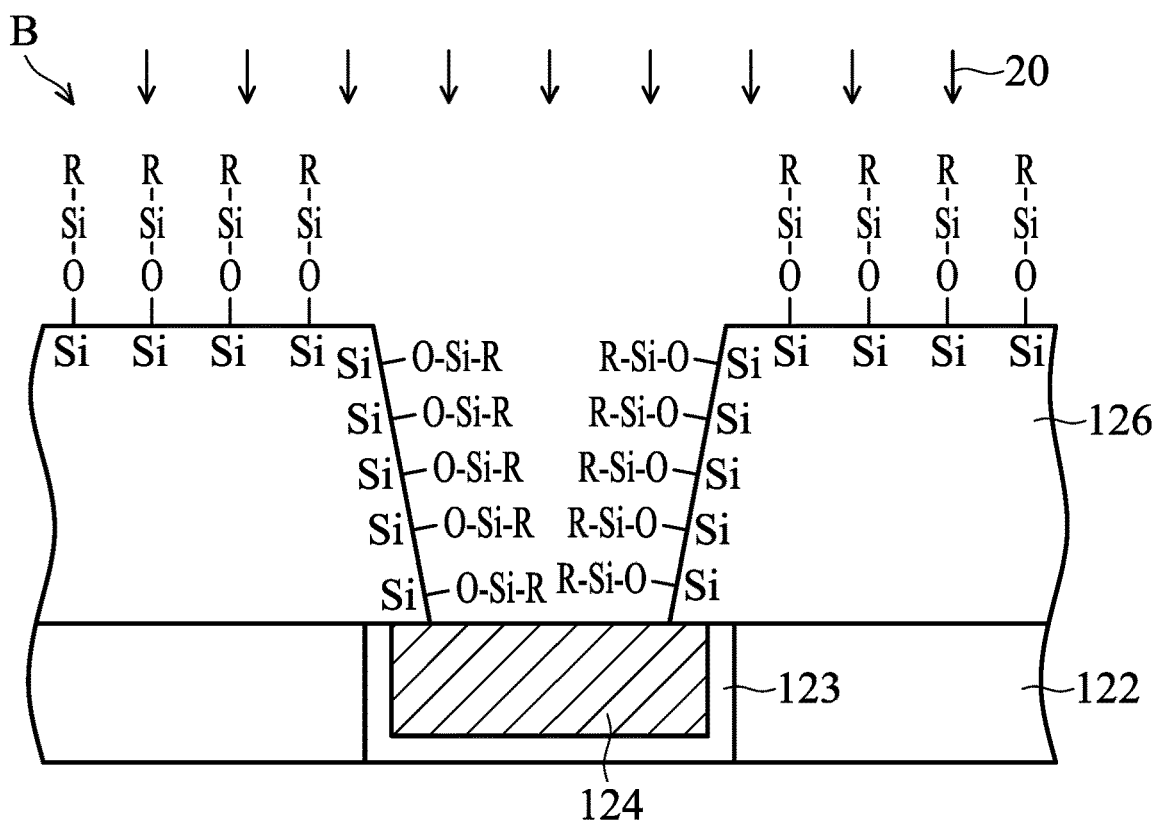
FIG. 3B shows an enlarged representation of region B of FIG. 1C, in accordance with some embodiments of the disclosure.

FIG. 3B shows an enlarged representation of region B of FIG. 1C, in accordance with some embodiments of the disclosure. As shown in FIG. 3B, during the first surface treatment process 20, the chemical reaction shown in equation (I) occur to make the sidewall surfaces of the second dielectric layer 126 become more hydrophobic. Therefore, the polarity of the sidewall surfaces of the trench 127 is changed from hydrophilic to hydrophobic.

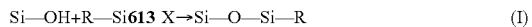

Si—OH+R—Si613 X→Si—O—Si—R    (I)

Figure 1D:
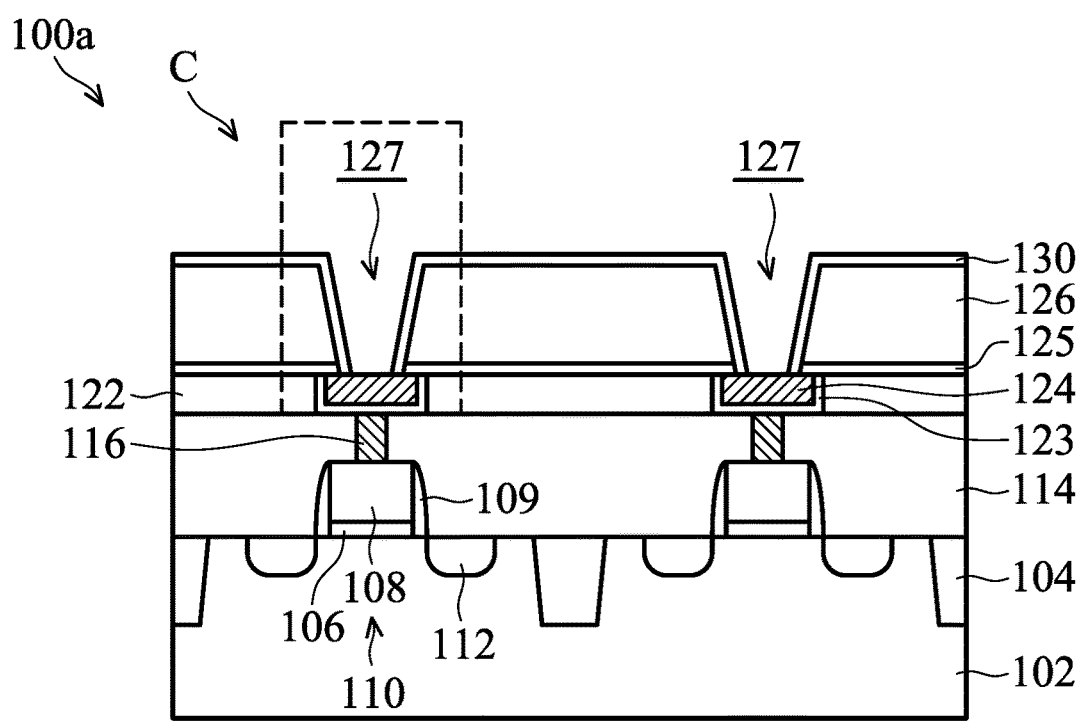

Afterwards, as shown in FIG. 1D and step 208 of FIG. 2, after the first surface treatment process 20, the hydrophobic layer 130 is formed on sidewall surfaces of the second dielectric layer 126, in accordance with some embodiments of the disclosure.

Figure 3C:
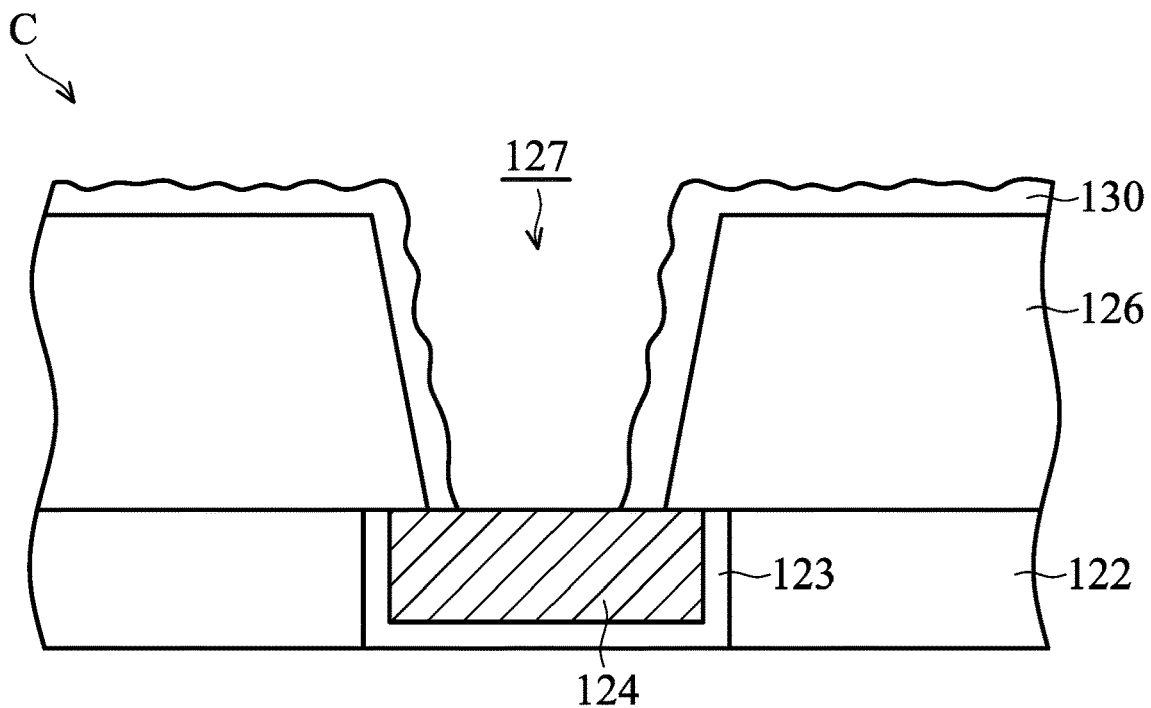
FIG. 3C shows an enlarged representation of region C of FIG. 1D, in accordance with some embodiments of the disclosure.

FIG. 3C shows an enlarged representation of region C of FIG. 1D, in accordance with some embodiments of the disclosure. Since the chemical reaction may not be performed uniformly at the exposed surface of the dielectric layer 126, the hydrophobic layer 130 may not be even and may have an irregular outer surface. In some other embodiments, some of the exposed surface of the dielectric layer 126 do not have the hydrophobic layer 130.

As shown in FIGS. 1D and 3C, since the silane compound is not reacted with the metal materials, the first metal layer 124 exposed by the bottom surface of the trench 127 will not react with silane compound. Therefore, the hydrophobic layer 130 is formed on sidewall surfaces of the second dielectric layer 126, but not formed on the bottom surface of the trench 127. The hydrophobic layer 130 is a continuous layer which is conformally formed on sidewall surfaces of the second dielectric layer 126 and on top surface of the second dielectric layer 126. The trench 127 is not completely filled with the hydrophobic layer 130. The trench 127 is partially filled with the hydrophobic layer 130.

In some embodiments, the hydrophobic layer 130 has a water contact angle in a range from about 50 degrees to about 180 degrees. The water contact angle range of the hydrophobic layer 130 represents that the surfaces of the hydrophobic layer 130 is more hydrophobic than the second dielectric layer 126. In some embodiments, the carbon (C) signal is detected by an Energy Dispersive X-Ray Analysis (EDX) analysis since the hydrophobic layer 130 is formed. The EDX is used to detect the element or elements present in the sample to be determined.

Figure 1E:
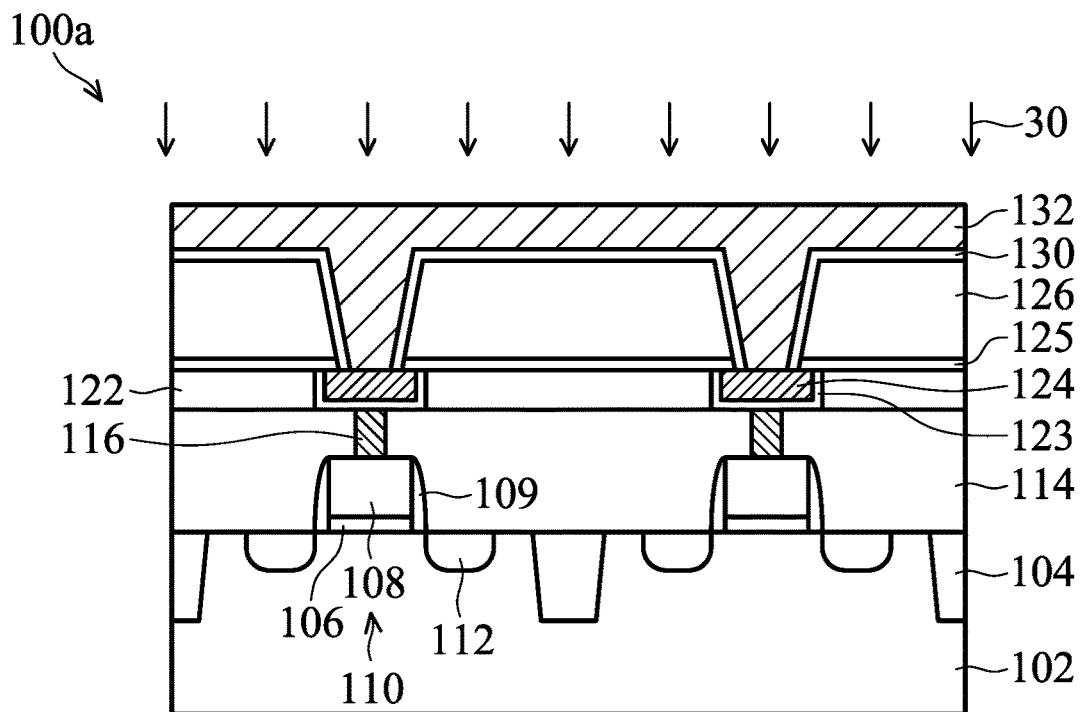

Afterwards, as shown in FIG. 1E and step 210 of FIG. 2, a metal material 132 is formed in the trench 127 and on the hydrophobic layer 130, in accordance with some embodiments of the disclosure.

In some embodiments, the metal material 132 is made of tungsten (W), cobalt (Co), copper (Cu), ruthenium (Ru), zirconium (Zr), hafnium (Hf), tantalum (Ta), aluminum (Al), or a combination thereof. In some embodiments, the metal material 132 is formed by an electroplating, electroless plating, printing, chemical vapor deposition (CVD) process or physical vapor deposition (PVD) process.

In some embodiments, the metal material 132 and the first metal layer 124 are made of different materials. For example, the first metal layer 124 is made of tungsten (W), and the metal material 132 is made of cobalt (Co). The electrical resistance (Rs) of the interconnect structure 120 is reduced since the metal material 132 is made of cobalt (Co) which has a lower resistance than tungsten (W).

Afterwards, as shown in FIG. 1E and step 212 of FIG. 2, a planarization process 30 is performed on the metal material 132, in accordance with some embodiments of the disclosure. In some embodiments, the planarization process 30 is a chemical mechanical polishing (CMP) process. The planarization process 30 is configured to remove the excess metal material 132 out of the trench 127.

It should be noted that during the planarization process 30, two surfaces treatment methods may be performed on the second metal material 132. As shown in step 212*b* of FIG. 2, a surface temperature controlling method is used. As shown in step 212*c* of FIG. 2, a solvent soaking method is used. Step 212*b* and step 212*c* of FIG. 2 are optionally performed to make the top surface of the via structure 134 become more hydrophobic. In step 212*b*, the surface treatment method is performed by controlling the surface temperature of the semiconductor device structure 100. In step 212*c*, the surface treatment method is performed by using a solvent soaking method.

Figure 4:
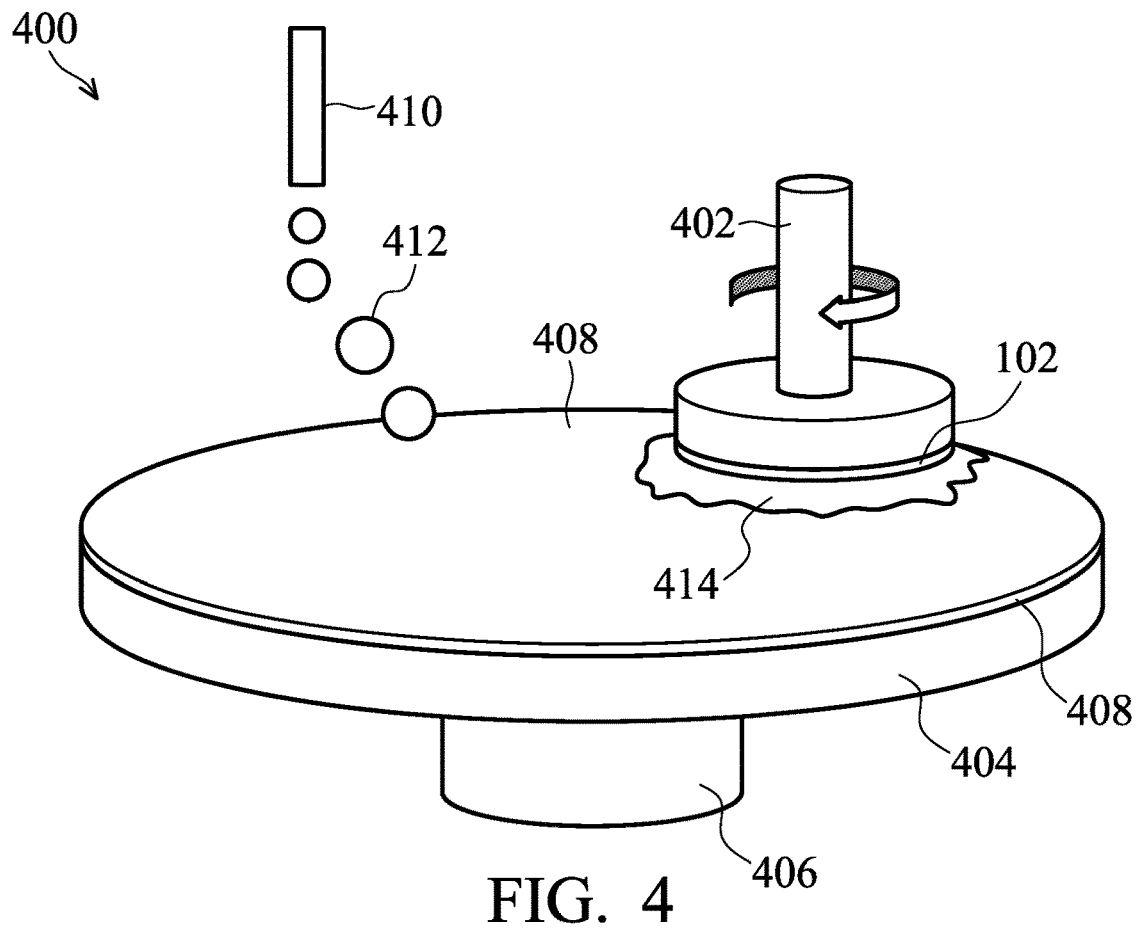
FIG. 4 shows a schematic front view of a chemical mechanical polishing (CMP) tool, in accordance with some embodiments of the disclosure.

FIG. 4 shows a schematic front view of a chemical mechanical polishing (CMP) tool 400, in accordance with some embodiments of the disclosure.

The substrate 102 is held by a head 402 which rotates about the central axis of the substrate 102. A polishing platen 404 is horizontally supported by a shaft 406. A polishing pad 408, made of a porous material, is attached to the upper surface of the polishing platen 404. A slurry arm 410 is positioned above the surface of the polishing pad 408. The slurry arm 410 dispenses a slurry 412, including an abrasive and at least one chemically-reactive agent and a solvent 414, on the polishing pad 408. The solvent 414 is uniformly dispersed on the polishing pad 408.

In some embodiments, the surface temperature of the semiconductor device structure 100*a* is controlled by detecting the temperature of the polishing pad 408. A cooling system (not shown) is disposed in the polishing platen 404 of the CMP tool 400 to cool the polishing pad 408. Therefore, the polishing pad 408 is cooled to maintain the semiconductor device structure 100 at a desired temperature. In some embodiments, a flow rate of the cooling water in the cooling system is in a range from about 1000 L/min to about 10000 L/min. In some embodiments, the surface temperature of the semiconductor device structure 100*a* is maintained within a range from about 10 degrees Celsius to about 15 degrees Celsius. It should be noted that when the surface temperature of the semiconductor device structure 100*a* is maintained within the above-mentioned range, the top surface of the via structure 134 becomes more hydrophobic.

In some other embodiments, as shown in step 212*b* of FIG. 2, the solvent soaking method includes providing the solvent 414 within the slurry on the surface of the metal material 132. In some embodiments, the solvent 414 includes methanol, ethanol, propanol, a combination thereof or another applicable solvent. In other embodiments, the solvent is used as a composite, and it includes methanol, ethanol, or propanol mixed with de-ionized water (DIW). In some embodiments, the solvent 414 in the cleaning solution has a concentration in a range from about 30 wt % to about 60 wt %. In some embodiments, the solvent soaking method is operated for a period of time in a range from about 1 minute to about 10 minutes.

The solvent soaking method is used to change surface characteristic from hydrophilic to hydrophobic behavior. As such, the more hydrophobic the surface becomes, the less of a possibility that metal loss in the underlying layers is induced due to using high metal corrosive polishing slurry on-top surface.

Figure 1F:
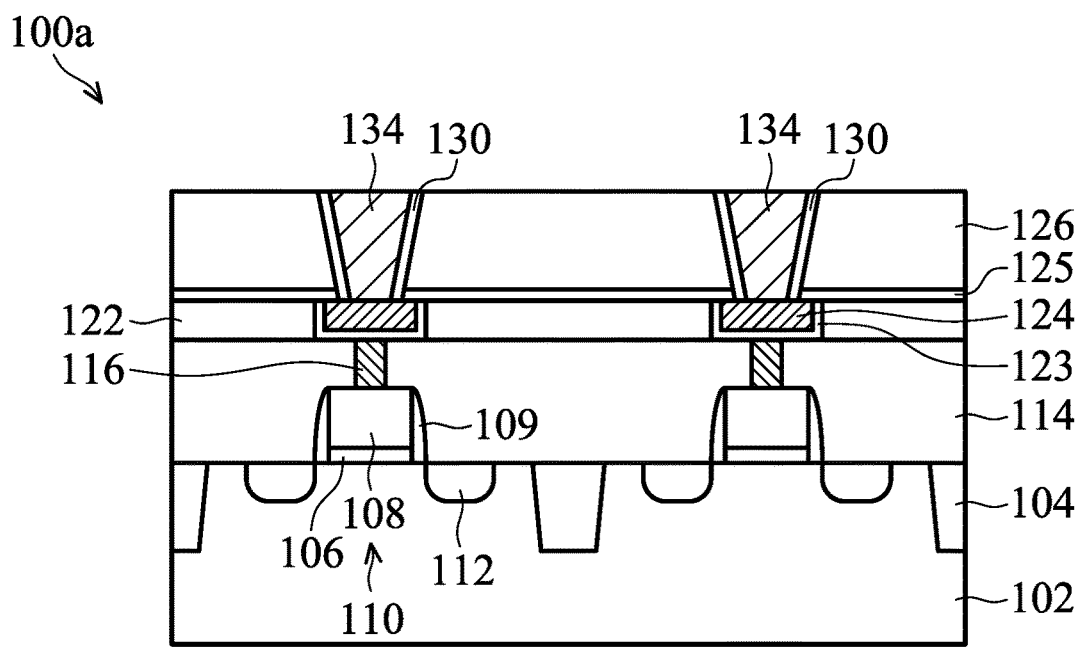
Figure 1F:
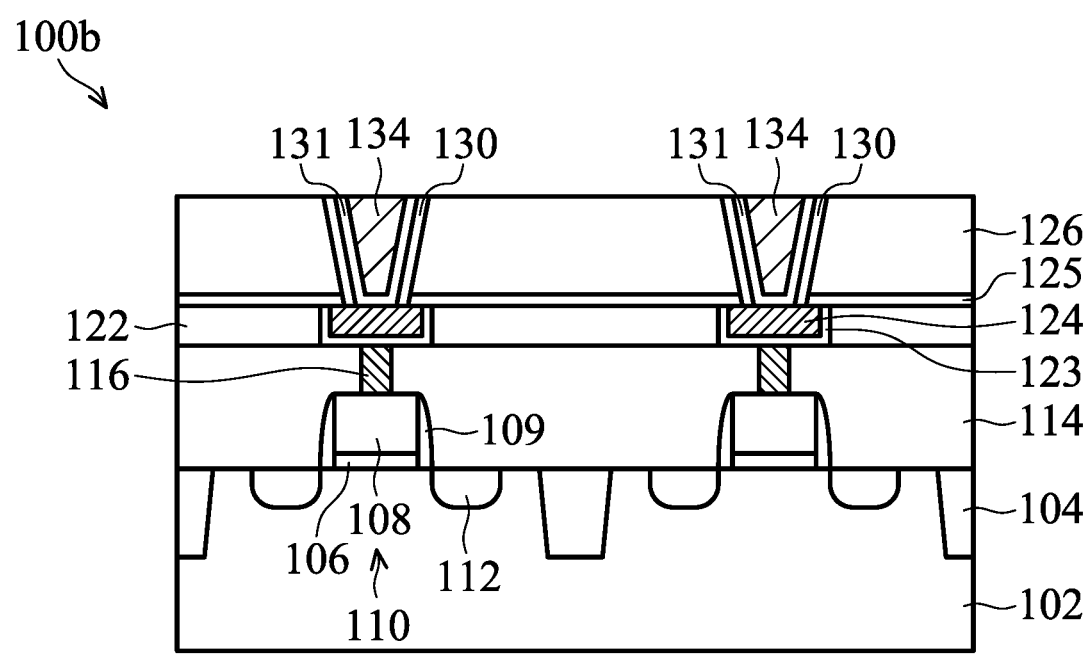

Afterwards, as shown in FIG. 1F, after the planarization process 30, the via structure 134 is formed over the first metal layer 124, in accordance with some embodiments of the disclosure.

It should be noted that the slurry 412 (shown in FIG. 4) used in the planarization process 30 may be designed for different characteristic materials, such as tungsten (W) and cobalt (Co). These two metal materials have opposite characteristics, one is an acid system and the other one is an alkaline system. If one of the slurries used to polish one metal material leaks via the sidewall, it will occur corrosive reaction at the other one metal material. During the planarization process 30, if no hydrophobic layer 130 is formed on sidewall surfaces of the via structure 134, the slurry 412 used in the planarization process 30 may leak into first metal layer 124 via the sidewall of the via structure 134. Therefore, the hydrophobic layer 130 is used to reduce slurry from leaking into under layer due to capillary phenomenon. In order to minimize the metal loss of the first metal layer 124, the hydrophobic layer 130 is formed on sidewall surfaces of the via structure 134.

Furthermore, the top surface of the via structure 134 becomes more hydrophobic by using the surface temperature controlling method (step 212b of FIG. 2) or the solvent soaking method (step 212c of FIG. 2). In order to prevent the slurry leak, the sidewall surfaces and the top surface of the via structure 134 are treated by various surface treatment methods. Since the hydrophobic layer 130 is formed on sidewall surfaces of the via structure 134 and the top surface of the via structure 134 become more hydrophobic, a reliable via structure 134 is formed. Therefore, the performance of the semiconductor device structure 100a is improved.

FIG. 1F' shows a cross-sectional representation of a semiconductor device structure 100b, in accordance with some embodiments of the disclosure. The semiconductor device structure 100b shown in FIG. 1F' is similar to, or the same as, the semiconductor device structure 100a shown in FIG. 1F, except that a barrier layer 131 is formed between the hydrophobic layer 130 and the via structure 134.

As shown in FIG. 1F' and step 209 of FIG. 2, the barrier layer 131 is formed on the hydrophobic layer 130. The barrier layer 131 has a U-shaped cross-section. The barrier layer 131 is used as an adhesive layer to improve the adhesion between the hydrophobic layer 130 and the via structure 134. In addition, the barrier layer 131 is used as a diffusion barrier layer to prevent the metal materials in the via structure 134 to diffuse into other layers. In some embodiments, the barrier layer 131 is made of tantalum (Ta), tantalum nitride (TaN), titanium (Ti), titanium nitride (TiN), cobalt tungsten (CoW) or another applicable material.

FIGS. 5A-5E show cross-sectional representations of various stages of forming a semiconductor device structure 100c, in accordance with some embodiments of the disclosure. The semiconductor device structure 100c shown in FIGS. 5A-5E is similar to, or the same as, the semiconductor device structure 100a shown in FIGS. 1A-1F, except that the via structure 144 is formed by different steps and includes a bottom portion and a top portion. Some stages of forming the semiconductor device structure 100c in FIGS. 5A-5E are corresponding to the flow chart of FIG. 2.

Figure 5A:
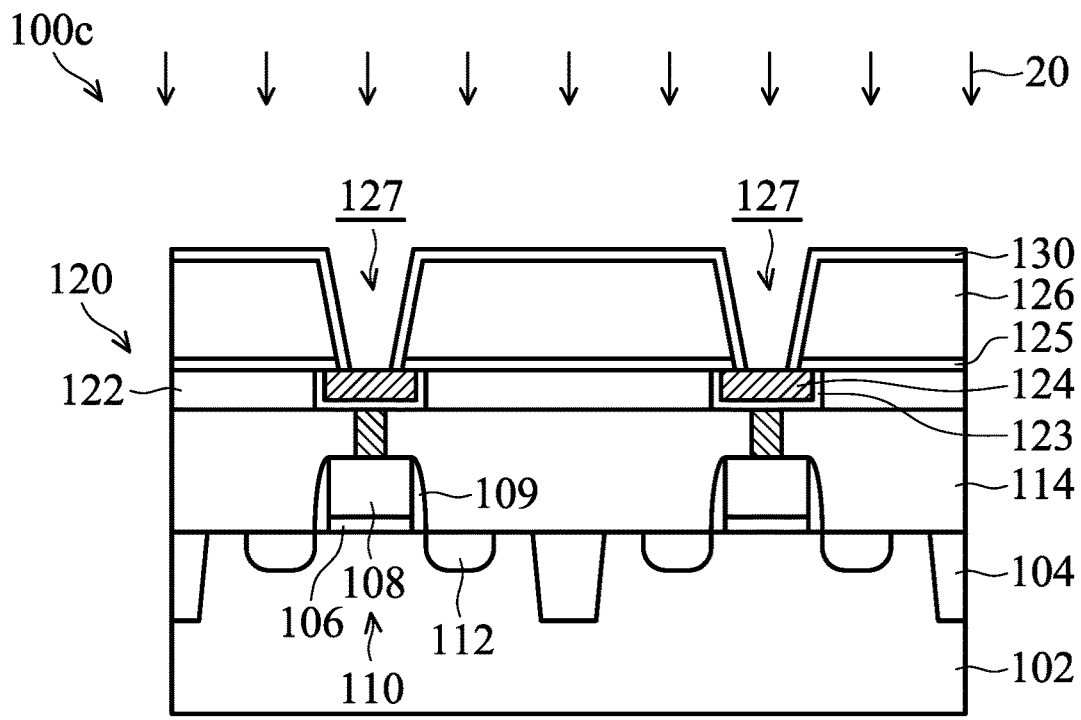
FIGS. 5A-5E show cross-sectional representations of various stages of forming a semiconductor device structure, in accordance with some embodiments of the disclosure.

As shown in FIG. 5A, the hydrophobic layer 130 is formed on sidewall surfaces of the trench 127. The hydrophobic layer 130 is formed by performing the first surface treatment process 20.

Figure 5B:
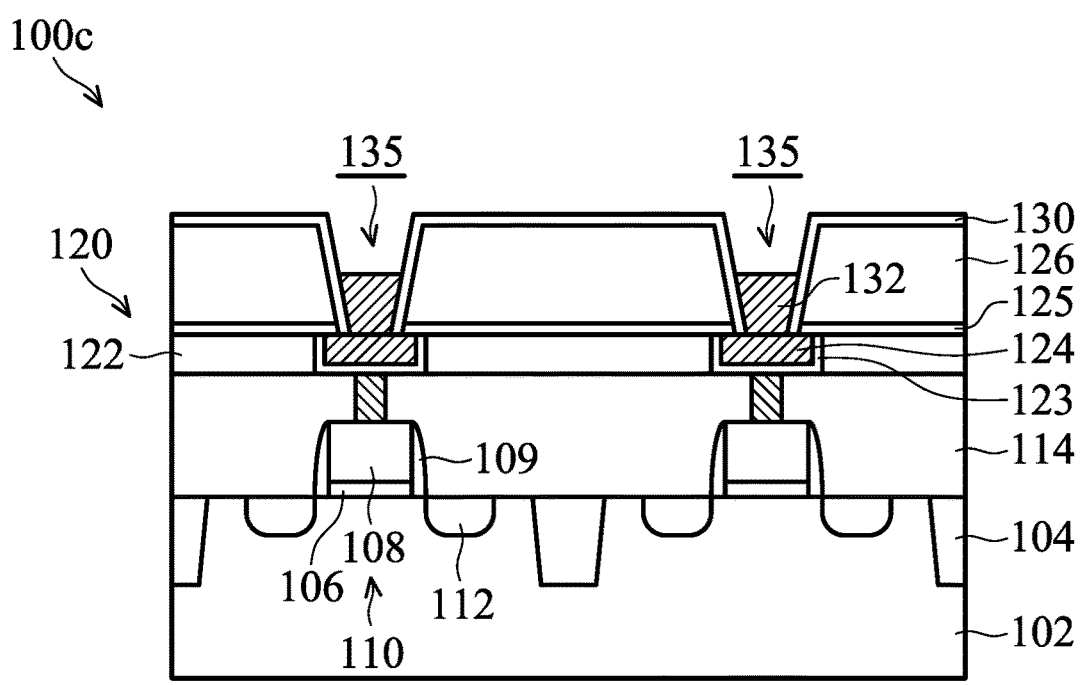

Next, as shown in FIG. 5B, the first metal material 132 is formed on a portion of the trench 127, in accordance with some embodiments of the disclosure. It should be noted that the trench 127 is not completely filled with the first metal material 132. Therefore, a recess 135 is formed on the top surface of the first metal material 132. In some embodiments, the first metal material 132 is deposited in the trench 127 and on the hydrophobic layer 130, and then a planarizing process and an etching back process are sequentially performed.

Figure 5C:
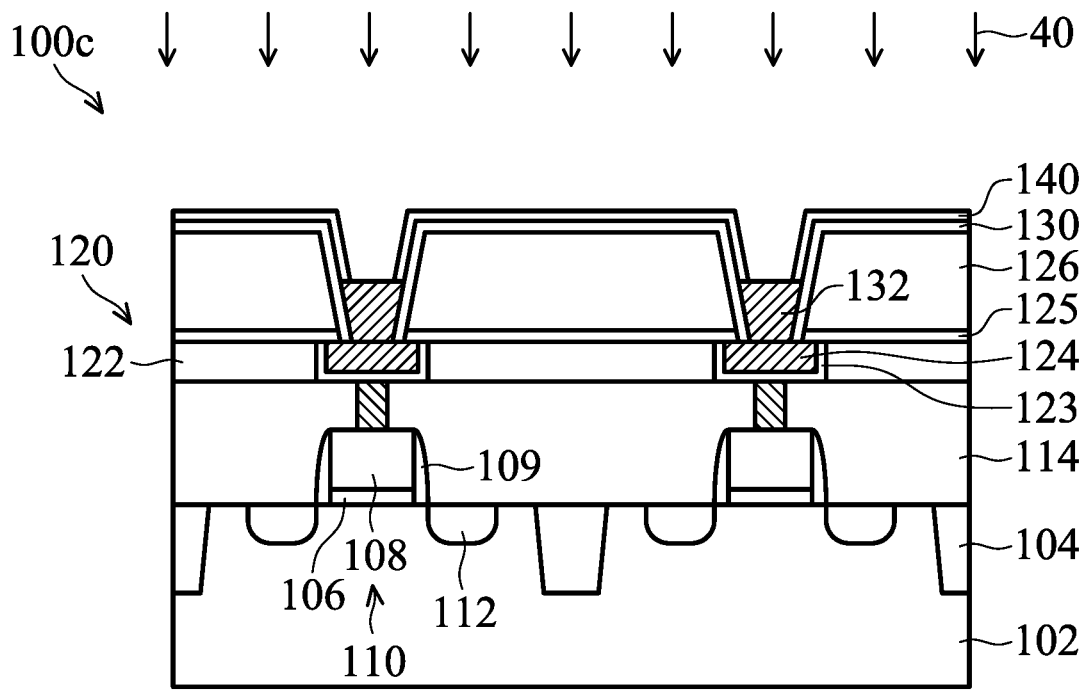

Afterwards, as shown in FIG. 5C, a second surface treatment process 40 is performed on the recess 127 to form a second hydrophobic layer 140 and help to ensure that the surfaces potentially exposed to the planarization process 30 are of sufficient hydrophobicity to help prevent leakage of corrosive slurry materials, in accordance with some embodiments of the disclosure. In some embodiments, the second hydrophobic layer 140 is formed by using a chemical soaking method similar to the chemical soaking method described above to achieve a second hydrophobic surface. However, in this embodiment the chemical soaking method is performed without polishing, and the chemicals used in the chemical soaking method include hydrophobic components to form the second hydrophobic layer 140. In some embodiments, the hydrophobic layer 130 is different from the second hydrophobic layer 140, depending on the properties of the first metal material 132 and the second metal material 142 to choose proper treatment chemical. The material and fabrication method of the second hydrophobic layer «is similar to, or the same as, the first hydrophobic layer 130.

Figure 5D:
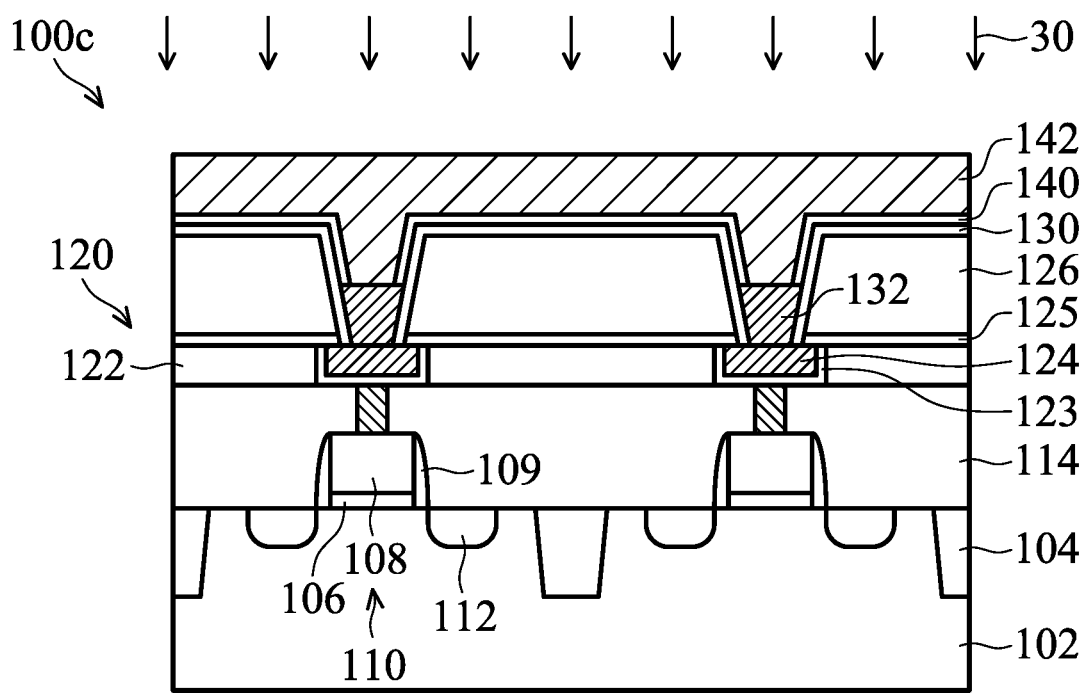

Afterwards, as shown in FIG. 5D, a second metal material 142 is formed on the second hydrophobic layer 140, and then the planarization process 30 is performed on the second metal material 142, in accordance with some embodiments of the disclosure. The second hydrophobic layer 140 is formed on the first hydrophobic layer 130.

It should be noted that during the planarization process 30, step 212b and step 212c of FIG. 2 are optionally performed to make the top surface of the via structure 134 become more hydrophobic. In step 212b, the surface treatment method is performed by controlling the surface temperature of the semiconductor device structure 100. In step 212c, the surface treatment method is performed by a solvent soaking method.

Figure 5E:
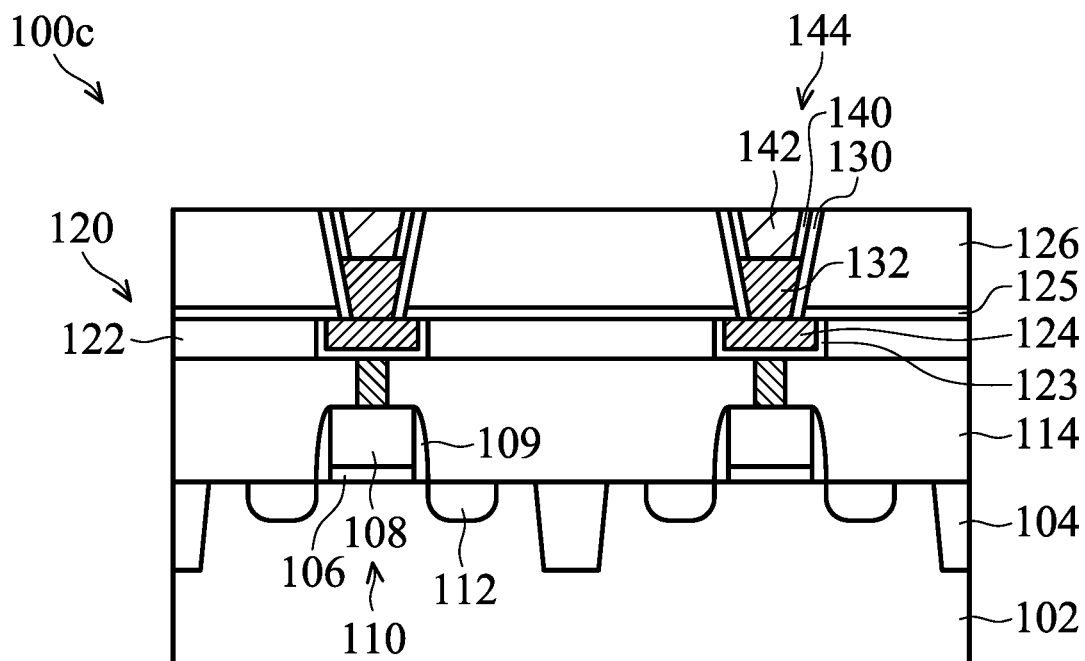
Figure 5E:
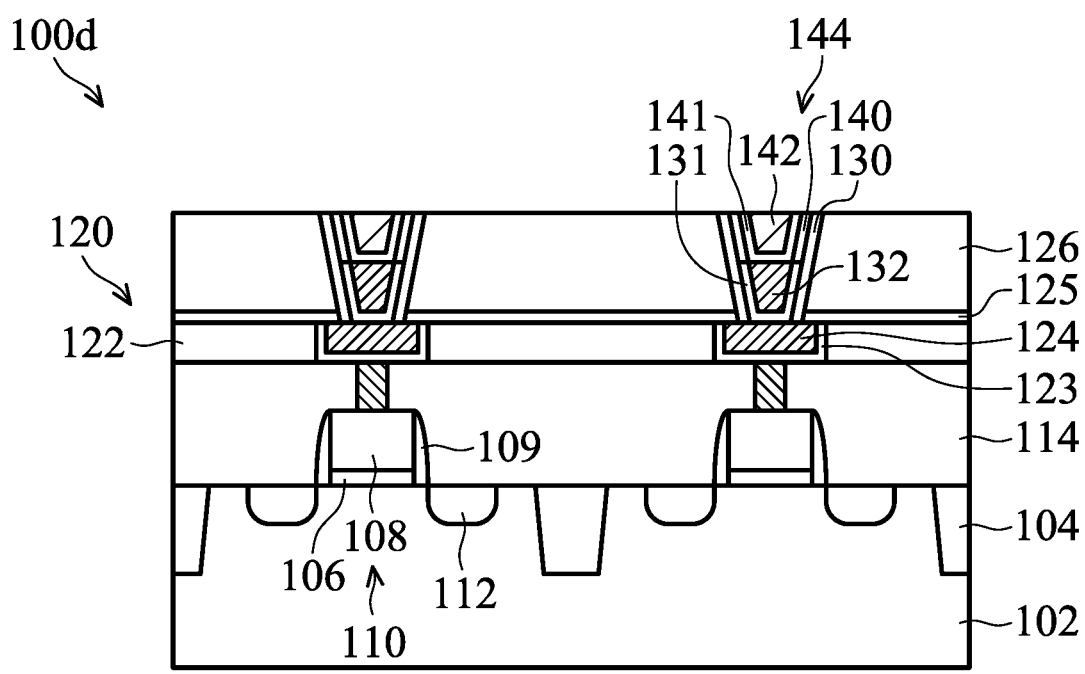

Subsequently, as shown in FIG. 5E, a via structure 144 including the second metal material 142 and the first metal material 132 is formed, in accordance with some embodiments of the disclosure. The via structure 144 includes a bottom portion (or the first metal material 132) and a top portion (or the second metal material 142) on the bottom portion. The bottom portion and the top portion may be made of different materials. When the bottom portion and the top portion are made of different materials, an interface is between the first metal material 132 and the second metal material 142. In some embodiments, the interface can be observed using an electron microscope, such as a scanning electron microscope (SEM), and/or spectroscopy technology, such as an energy-dispersive X-ray spectroscopy (EDS, EDX or XEDS).

As shown in FIG. 2, it should be noted that the surface treatment cycle includes repeating steps 206-210 until the sidewall surfaces of the trench 127 are well modified. The surface modification degree is observed by monitoring the contact angle. In some embodiments, the sidewall surfaces of the trench 127 are well modified when the contact angles of the sidewall surfaces of the trench 127 are at least over 50 degrees. In some embodiments, if the sidewall surfaces of the trench 127 are not treated enough, the surface treatment process is operated again by repeating steps 206-210.

FIG. 5E' shows a cross-sectional representation of a semiconductor device structure 100d, in accordance with some embodiments of the disclosure. The semiconductor device structure 100d shown in FIG. 5E' is similar to, or the same as, the semiconductor device structure 100c shown in FIG. 5E, except that a first barrier layer 131 is formed between the first hydrophobic layer 130 and the first metal material 132, and a second barrier layer 141 is formed between the second hydrophobic layer 140 and the second metal material 142.

Figure 6:
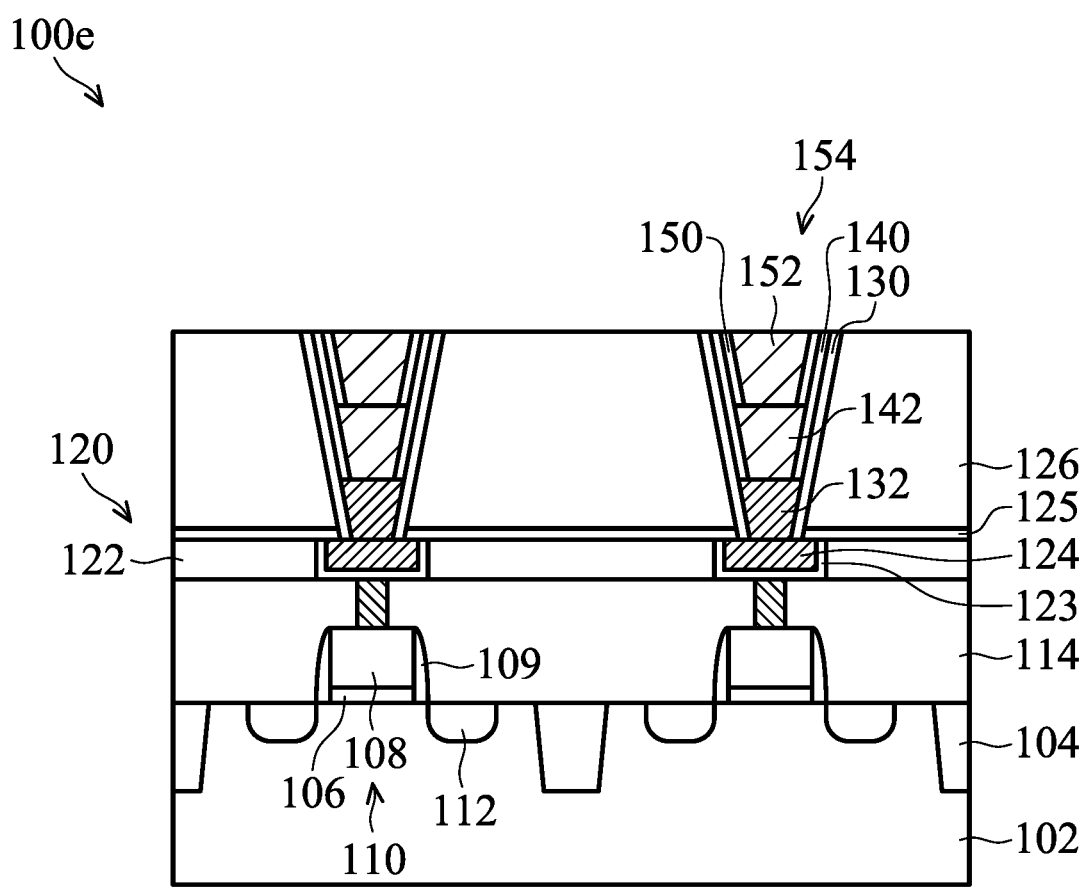
FIG. 6 shows a cross-sectional representation of a semiconductor device structure, in accordance with some embodiments of the disclosure.

FIG. 6 shows a cross-sectional representation of a semiconductor device structure 100e, in accordance with some embodiments of the disclosure. The semiconductor device structure 100e shown in FIG. 6 is similar to, or the same as, the semiconductor device structure 100d shown in FIG. 5E', except that the via structure 154 includes three portions.

As shown in FIG. 6, the second hydrophobic layer 140 is formed on the first hydrophobic layer 130, and a third hydrophobic layer 150 is formed on the second hydrophobic layer 140. The second metal material 142 is formed on the first metal material 132, and a third metal material 152 is formed on the second metal material 142. Therefore, a via structure 154 includes a bottom portion (the first metal material 132), a middle portion (the second metal material 142) and a top portion (the third metal material 152). In some embodiments, when the first metal material 132, the second metal material 142 and the third metal material 152 are made of three different materials, two interface exist. The first interface is between the first metal material 132 and the second metal material 142, and the second interface is between the second metal material 142 and the third metal material 152.

Figure 7A:
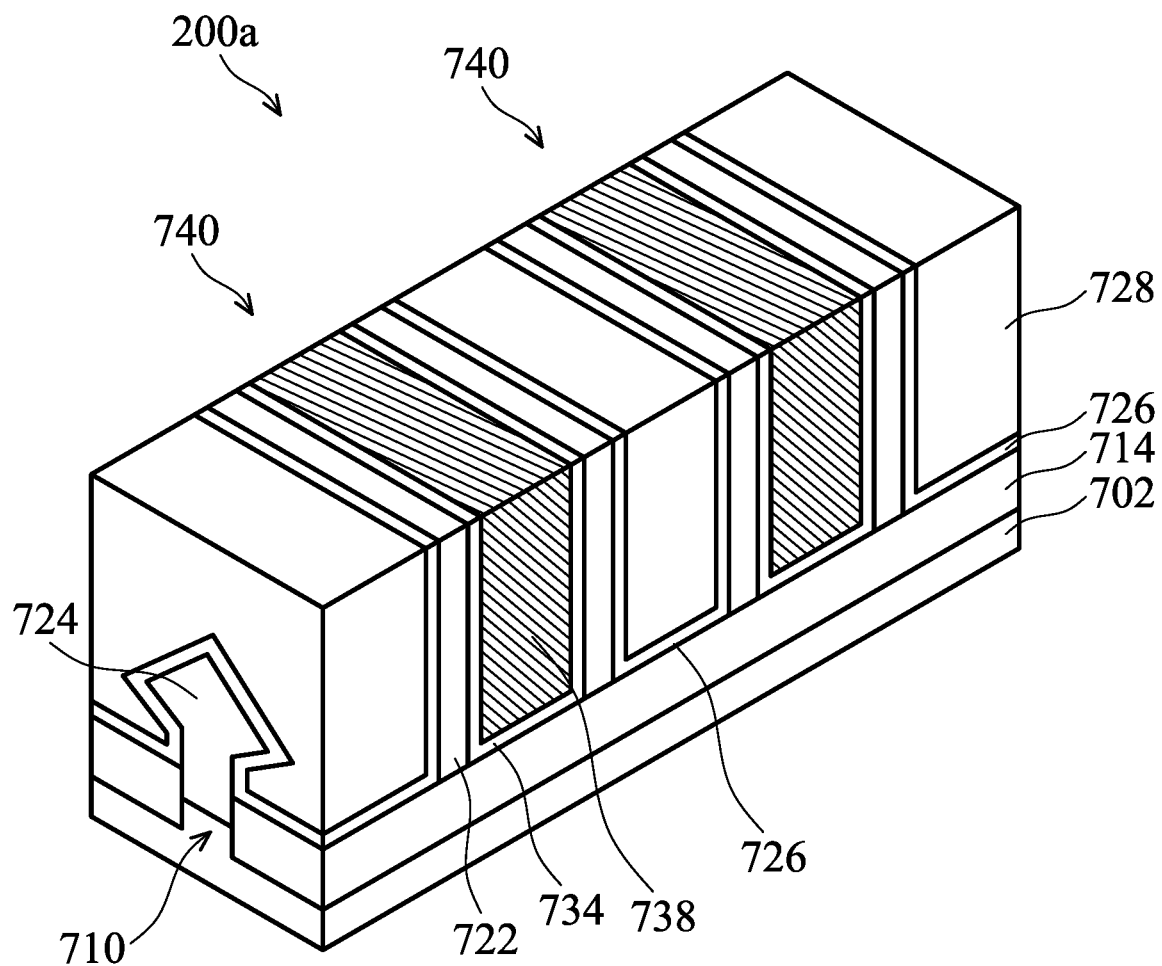
FIGS. 7A-7B show perspective representations of various stages of forming a semiconductor structure, in accordance with some embodiments of the disclosure.
Figure 7B:
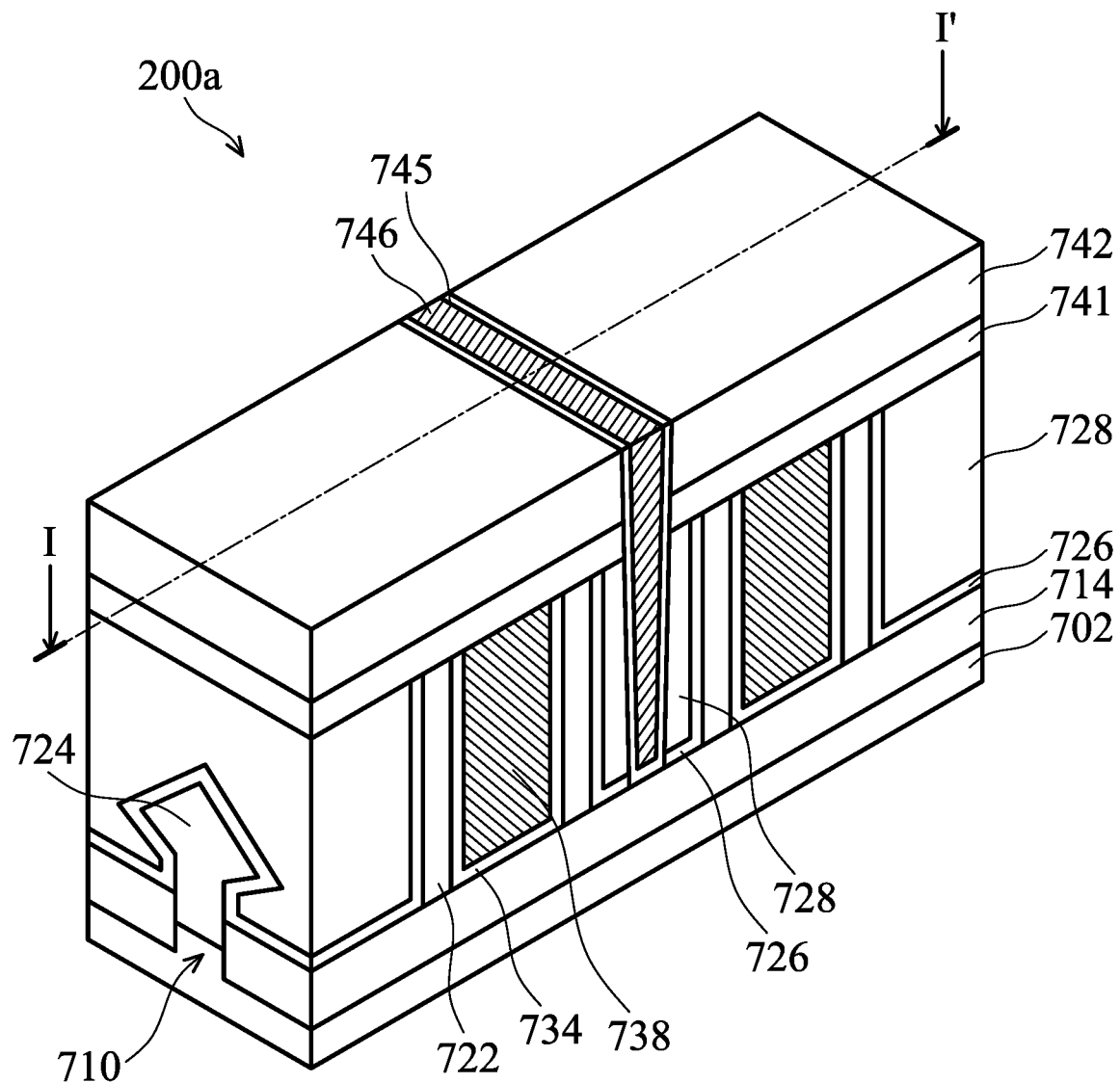

FIGS. 7A-7B show perspective representations of various stages of forming a semiconductor structure 200a, in accordance with some embodiments of the disclosure. The semiconductor structure 200a is a FinFET device structure. Some stages of forming the semiconductor device structure 200a in FIGS. 7A-7B are corresponding to the flow chart of FIG. 2.

As shown in FIG. 7A, a fin structure 710 is formed over a substrate 702. An isolation structure 714 is formed over the fin structure 710, and source/drain (S/D) structures 724 are formed over the fin structure 710. A contact etch stop layer (CESL) 726 is formed over the substrate 702, and an inter-layer dielectric (ILD) layer 728 is formed over the CESL 726. Next, a gate structure 740 is formed over the fin structure 710. The gate structure 740 includes a gate dielectric layer 734 and a gate electrode layer 738 formed on the gate dielectric layer 734. The gate structure 740 is located between the gate spacer layers 722.

Afterwards, as shown in FIG. 7B, a first etching stop layer 741 is formed over the gate structure 740 and over the ILD layer 728, and a first dielectric layer 742 is formed over the first etching stop layer 741, in accordance with some embodiments of the disclosure.

Next, a portion of the ILD layer 728 is removed to form a trench (not shown). Subsequently, a barrier layer 745 is formed in the sidewall surfaces of the trench, and a source/drain contact structure 746 is formed on the barrier layer 745.

Figure 8A:
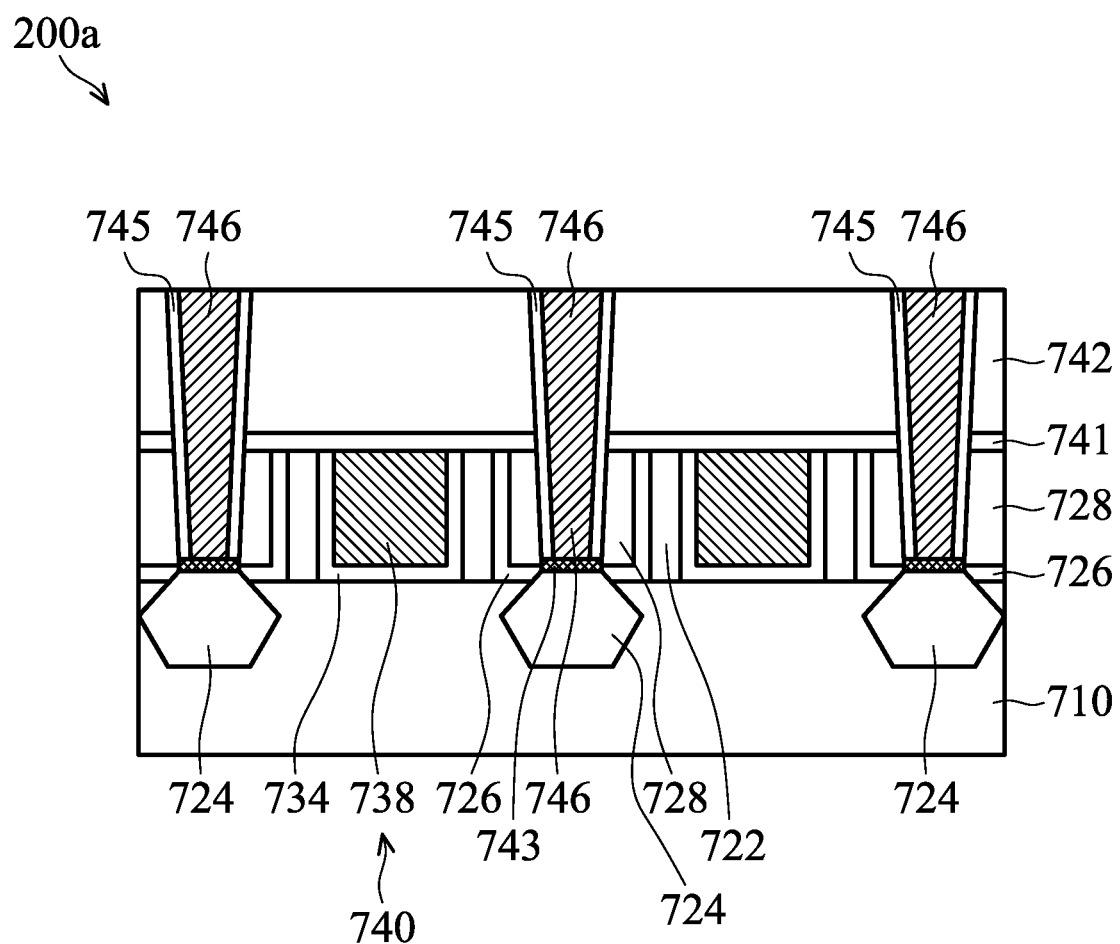
FIGS. 8A-8E show cross-sectional representations of various stages of forming a FinFET device structure after the structure of FIG. 7B, in accordance with some embodiments of the disclosure.

FIGS. 8A-8E show cross-sectional representations of various stages of forming a FinFET device structure 200a after the structure of FIG. 7B, in accordance with some embodiments of the disclosure. FIG. 8A is a cross-sectional representation taken along line I-I' of FIG. 7B. Some stages of forming the semiconductor device structure 200a in FIGS. 8A-8E are corresponding to the flow chart of FIG. 2.

As shown in FIG. 8A, the source/drain (S/D) structures 724 are formed over the fin structure 710, and a metal silicide layer 743 is formed on the S/D structure 724. The S/D contact structure 746 is formed on the metal silicide layer 743. In some embodiments, the S/D structures 724 include Ge, SiGe, InAs, InGaAs, InSb, GaAs, GaSb, InAlP, InP, or the like.

Figure 8B:
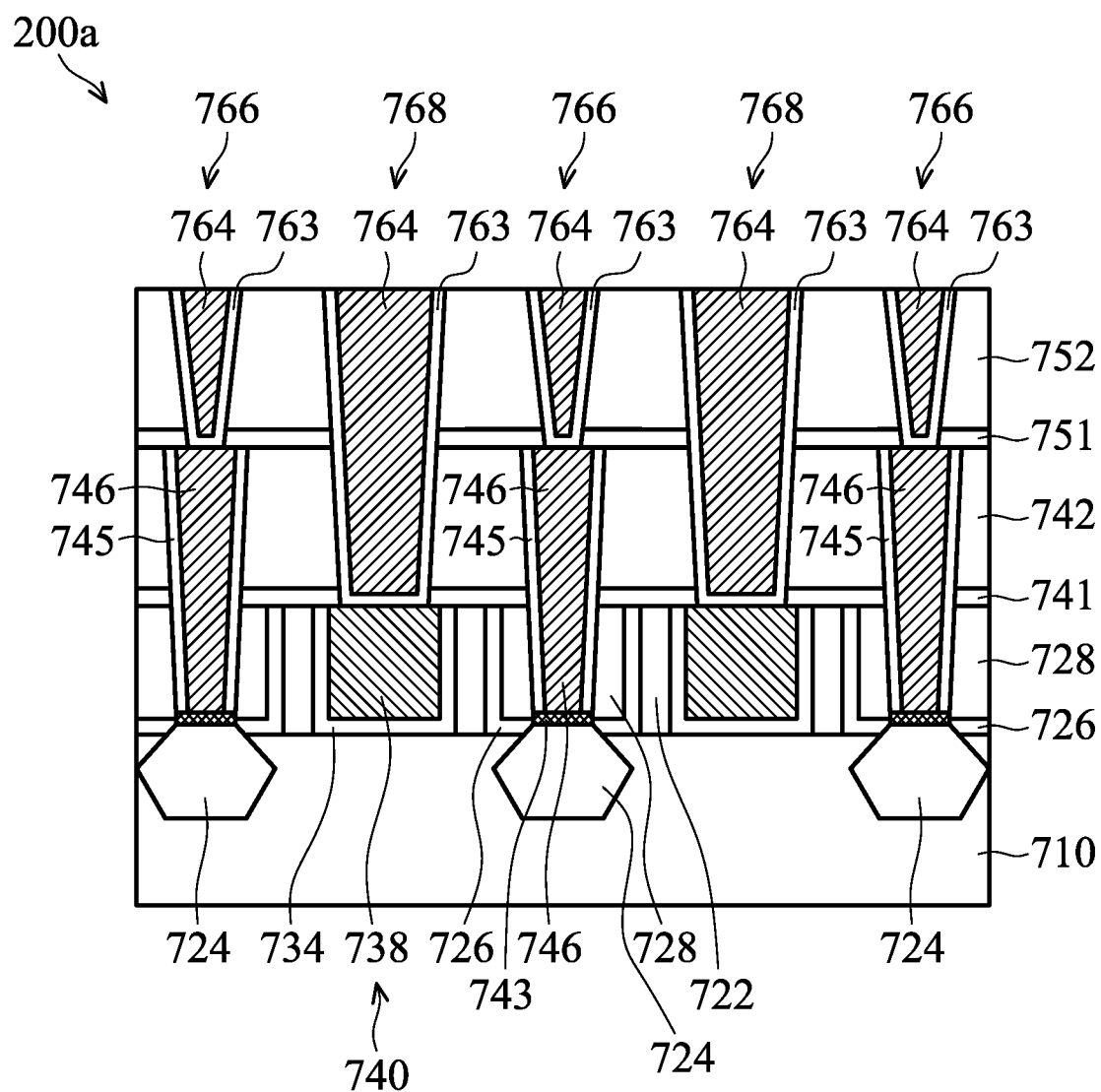

Afterwards, as shown in FIG. 8B, a second etching stop layer 751 is formed on the S/D contact structure 746 and a second dielectric layer 752 is formed on the second etching stop layer 751, in accordance with some embodiments of the disclosure.

Next, a barrier layer 763 is formed over the S/D contact structure 746, and a conductive layer 764 is formed over the barrier layer 763. A source/drain conductive plug 766 includes the U-shaped barrier layer 763 and the conductive layer 764, and a gate contact structure 768 includes the U-shaped barrier layer 763 and the conductive layer 764.

Figure 8C:
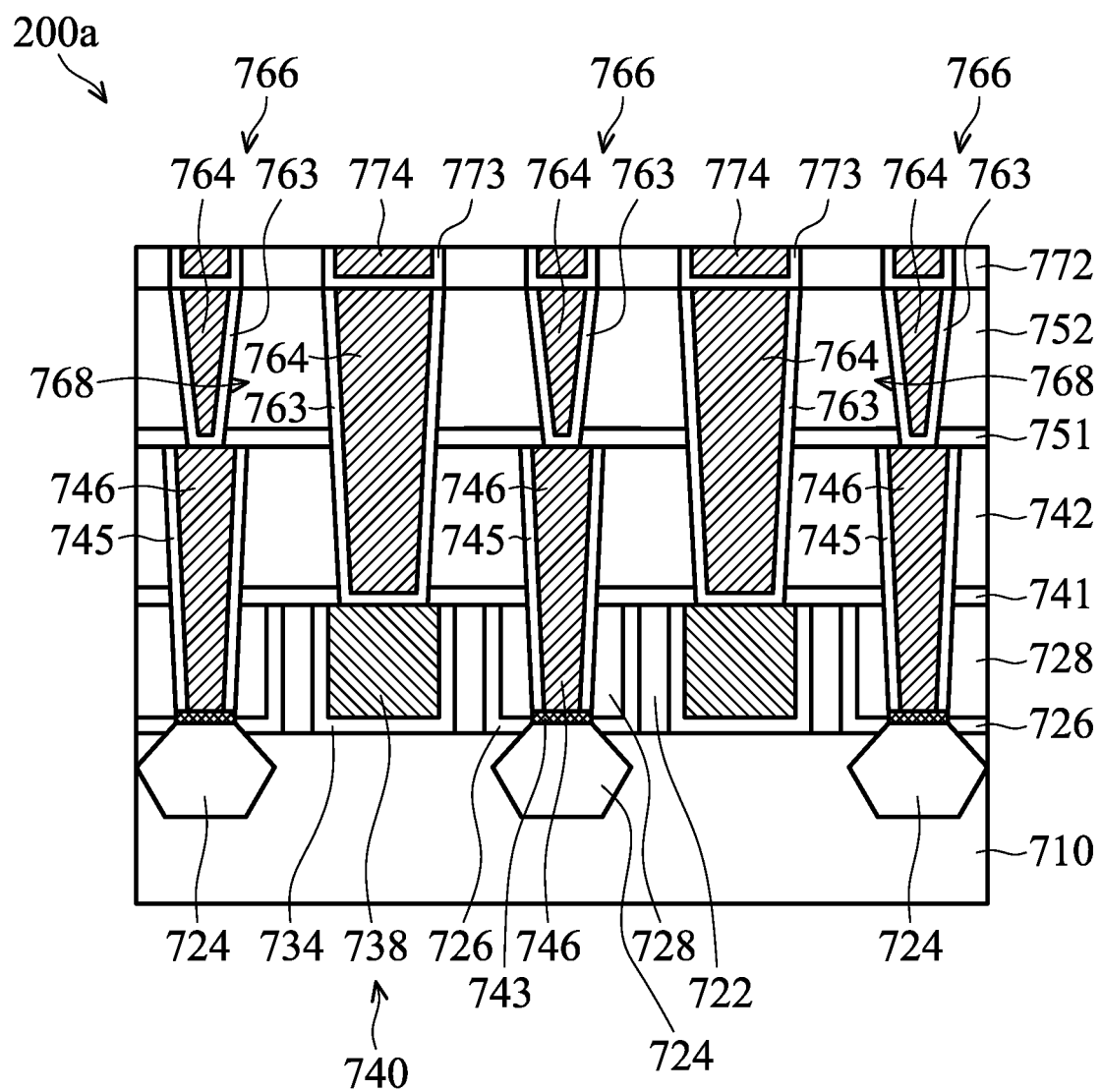

Afterwards, as shown in FIG. 8C, a third dielectric layer 772 is formed over the S/D conductive plug 766 and the gate contact structure 768, in accordance with some embodiments of the disclosure. Next, a barrier layer 773 is formed in the third dielectric layer 772, and a first metal layer 774 is formed over the barrier layer 773.

Figure 8D:
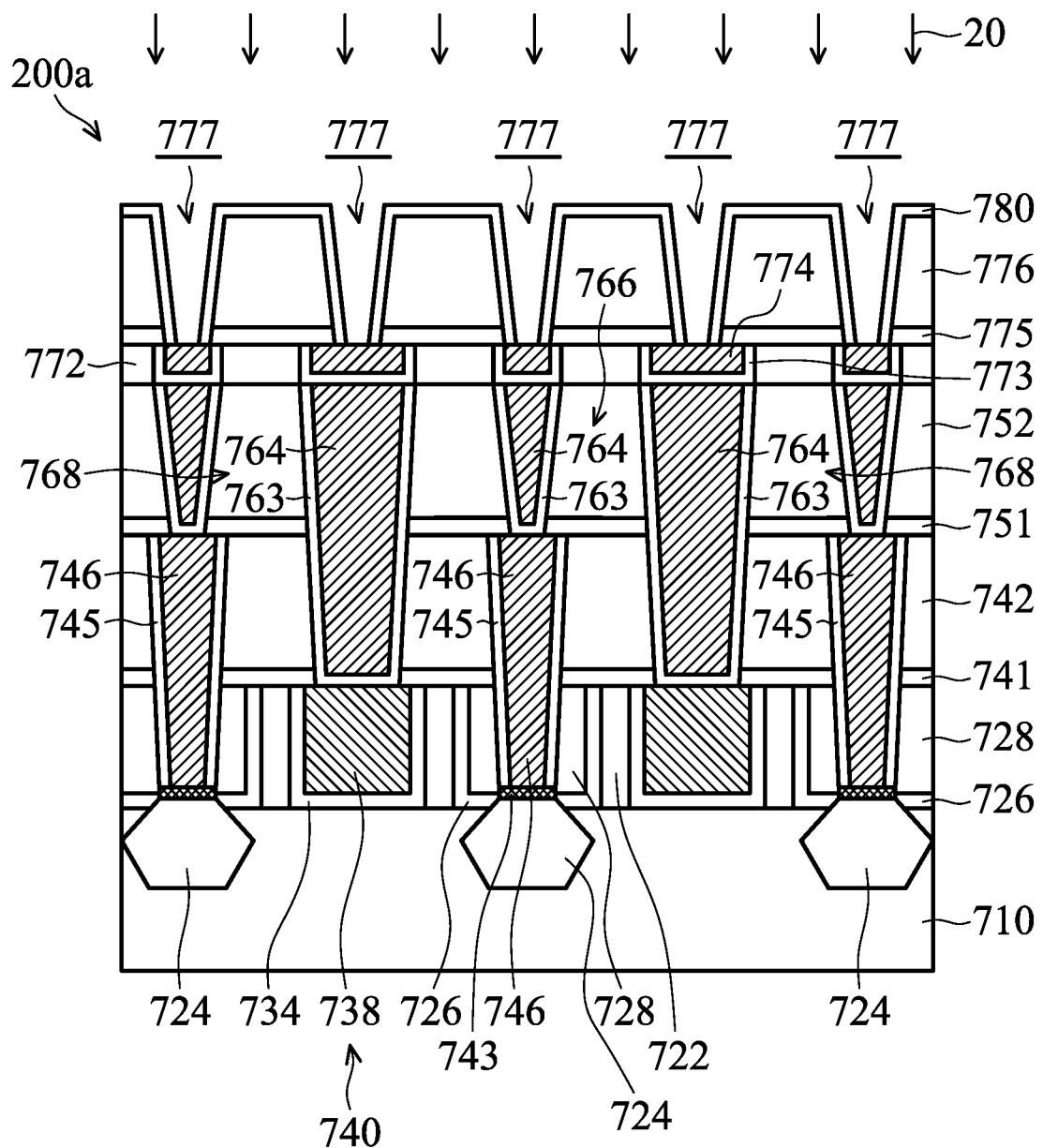

Afterwards, as shown in FIG. 8D, a third etching stop layer 775 is formed over the first metal layer 774, and a fourth dielectric layer 776 is formed over the third etching stop layer 775, in accordance with some embodiments of the disclosure.

Next, a trench 777 is formed in the fourth dielectric layer 776, and a first hydrophobic layer 780 is formed in sidewall surfaces of the trench 777 by performing the surface treatment process 20.

Figure 8E:
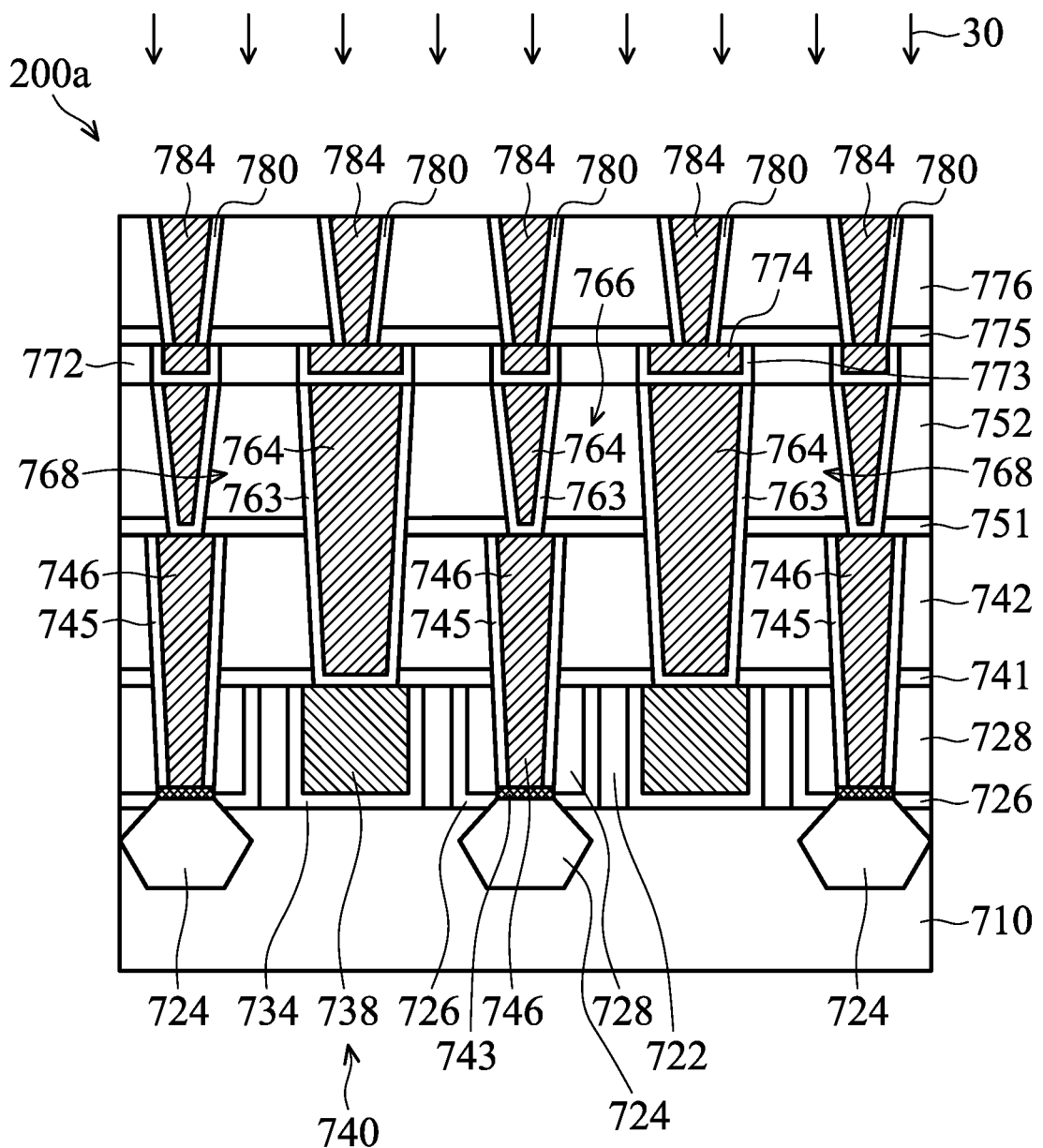
Figure 8E:
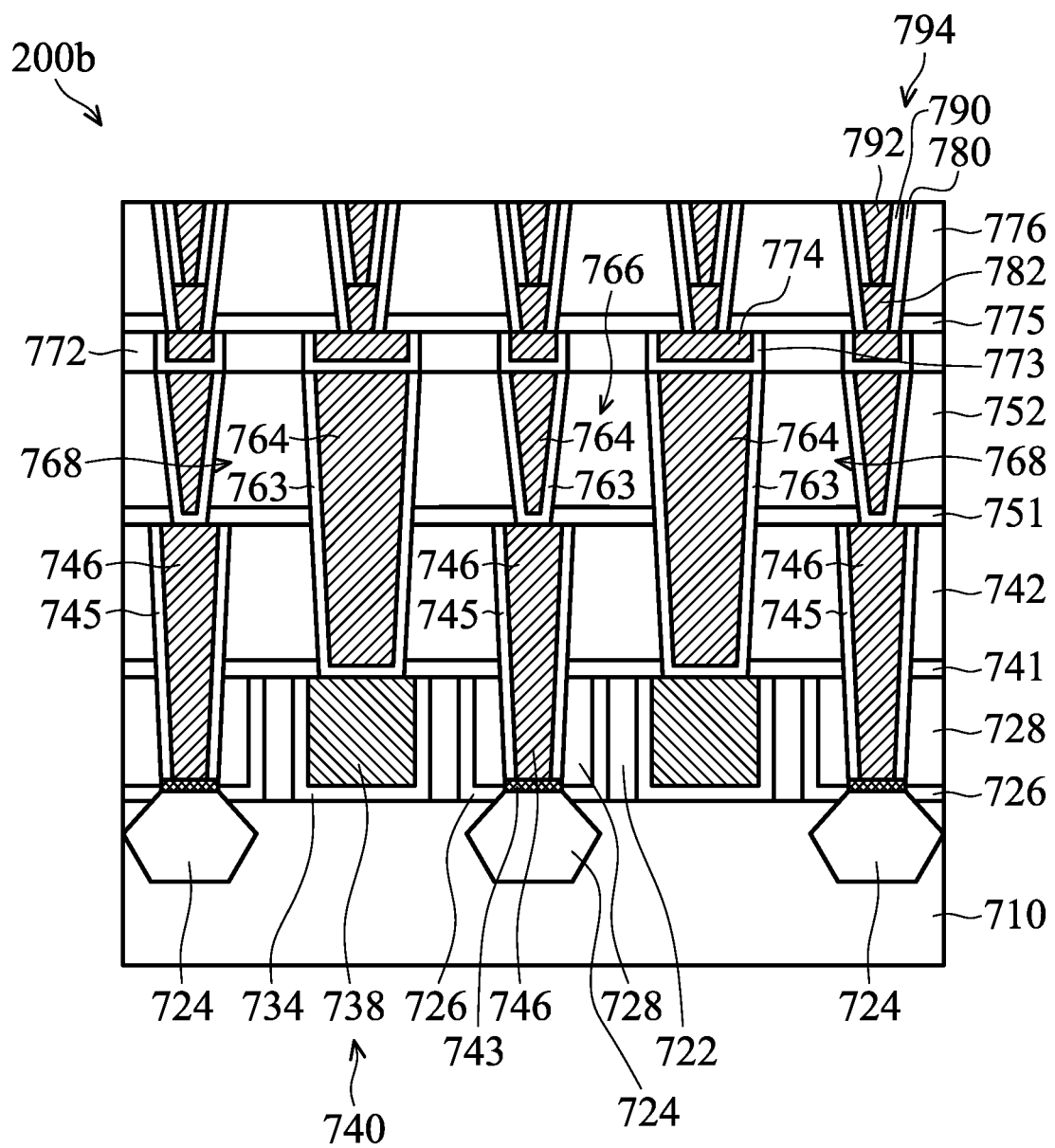

Afterwards, as shown in FIG. 8E, a via structure 784 is formed over the first hydrophobic layer 780, in accordance with some embodiments of the disclosure.

It should be noted that, before forming the via structure 784, the planarization process 30 is performed to remove the excess metal material. During the planarization process 30, step 212b and step 212c of FIG. 2 are optionally performed to make the top surface of the via structure 784 become more hydrophobic. In step 212b, the surface treatment method is performed by controlling the surface temperature of the semiconductor device structure 200a. In step 212c, the surface treatment method is performed by a solvent soaking method.

The interconnect structure is formed over the fin structure 710 and the S/D conductive plug 766 and the gate contact structure 768. In order to prevent the first metal layer 774 from being damaged, the first hydrophobic layer 780 is formed on sidewall surfaces of the via structure 784.

FIG. 8E' shows a cross-sectional representation of a semiconductor device structure 200b, in accordance with some embodiments of the disclosure. The semiconductor device structure 200b shown in FIG. 8E' is similar to, or the same as, the semiconductor device structure 200a shown in FIG. 8E, except that a second hydrophobic layer 790 is formed over the first hydrophobic layer 780, and a via structure 794 includes a first metal material 782 and a second metal material 792 over the first metal material 782.

There are various surface treatment methods for preventing metal loss in an interconnect structure. In the first surface treatment method, a hydrophobic layer is formed on the sidewall surfaces of the via structure. In addition, the second surface treatment method and the third surface treatment may optionally be performed on the top surface of the via structure. Therefore, the issue of metal loss can be resolved.

Embodiments for forming a semiconductor device structure and method for formation of the same are provided. An interconnect structure is formed over a substrate. The interconnect structure includes a first metal layer formed in a first dielectric layer, and a second dielectric layer formed over the first dielectric layer. A via structure is formed in the second dielectric layer and over the first metal layer. Before forming the via structure, a planarization process is performed. However, the slurry used in the planarization process may leak into the under layers through the sidewall. Therefore, a hydrophobic layer is formed between the via structure and the second dielectric layer. The hydrophobic layer is formed by sidewall surface modification treatment. Furthermore, during the planarization process, the surface temperature controlling method and/or the solvent soaking method are optionally performed on the top surface of the via structure, and therefore the via structure becomes more hydrophobic. Since the sidewall surfaces and the top surface of the via structure are protected, a more reliable via structure is formed. Therefore, the performance of the semiconductor device structure is improved.

In some embodiments, a method for forming a semiconductor device structure includes: forming an interconnect structure over a substrate, wherein forming the interconnect structure comprises: forming a first metal layer over the substrate; forming a dielectric layer over the first metal layer; forming a trench in the dielectric layer; performing a surface treatment process to form a hydrophobic layer on a sidewall surface of the dielectric layer; and forming a metal material in the trench and over the hydrophobic layer to form a via structure on the first metal layer. In an embodiment, the performing the surface treatment process comprises: providing a gas mixture on the sidewall surface of the trench, wherein the gas mixture comprises a silane compound. In an embodiment the silane compound comprises: trialkoxysilane, dialkoxysilane, monoalkoxy, dipodal silane or a combination thereof. In an embodiment the method further includes forming a barrier layer on the hydrophobic layer and in the trench. In an embodiment the method further includes: performing a planarization process to remove a portion of the metal material out of the trench. In an embodiment the performing the planarization process includes: providing a solvent on the metal material, wherein the solvent comprises methanol, ethanol, propanol or a combination thereof. In an embodiment the performing the planarization process includes: maintaining a surface temperature of the semiconductor device structure within a range from about 10 degrees Celsius to about 15 degrees Celsius. In an embodiment the hydrophobic layer has a water contact angle in a range from about 50 degrees to about 180 degrees.

In some embodiments, a method for forming a semiconductor device structure, including: forming a first metal layer over a substrate; forming a dielectric layer over the first metal layer; forming a trench in the dielectric layer, the trench being above the first metal layer; performing a first surface treatment process to form a first hydrophobic layer on a sidewall surface of the dielectric layer; forming a first metal material in a portion of the trench, wherein the first metal material is formed on the first hydrophobic layer, and the trench is partially filled with the first metal material to form a recess on the first metal material; after the forming the first metal material, performing a second surface treatment process on the recess to form a second hydrophobic layer on the first hydrophobic layer; and forming a second metal material on the second hydrophobic layer and the first metal material. In an embodiment the method further includes: performing a third surface treatment process on the recess to form a third hydrophobic layer on the second hydrophobic layer; and forming a third metal material on the third hydrophobic layer and the second metal material. In an embodiment the first surface treatment process is operated at a pressure in a range from about 10-6 torr to about 10-8 torr. In an embodiment the first surface treatment process comprises using a silane compound, and the silane compound comprises trialkoxysilane, monoalkoxysilane or dipoal silane. In an embodiment, the silane compound has a formula (I): R—Si—X (I), wherein R is an organofunctional group, X is hydrolyzable group, and the organofunctional group is an aromatic functional group, an amino acid functional group or a fluorine functional group. In an embodiment the method further includes: performing a planarization process to remove a portion of the second metal material out of the recess; and maintaining a surface temperature of the semiconductor device structure within a range from about 10 degrees Celsius to about 15 degrees Celsius during the planarization process. In an embodiment the first hydrophobic layer has a water contact angle in a range from about 50 degrees to about 180 degrees In some embodiments, a method for forming a semiconductor device structure, includes: forming a gate structure over a fin structure; forming a gate contact structure over the gate structure; forming a first metal layer over the gate contact structure; forming a dielectric layer over the first metal layer; forming a first trench in the dielectric layer; forming a first hydrophobic layer on a sidewall surface of the first trench; forming a first metal material in the first trench and over the first hydrophobic layer; and performing a planarization process to remove a portion of the first metal material out of the trench, wherein the first hydrophobic layer protects the first metal layer from being damaged during the planarization process. In an embodiment the method further includes: forming a source/drain structure in the fin structure; forming a source/drain contact structure over the source/drain structure; forming a source/drain conductive plug structure over the source/drain contact structure; forming the first metal layer over the source/drain conductive plug; forming the dielectric layer over the first metal layer; forming a second trench in the dielectric layer, wherein the second trench is adjacent to the first trench; forming the first hydrophobic layer in the second trench; and forming a second via structure over the first hydrophobic layer in the second trench. In an embodiment the method further includes: forming a second hydrophobic layer on a sidewall surface of the first hydrophobic layer; and forming a second metal material on the second hydrophobic layer and the first metal material. In an embodiment forming the first hydrophobic layer includes: providing a gas mixture on the sidewall surface of the first trench, wherein the gas mixture comprises a silane compound and a carrier gas. In an embodiment the silane compound has a formula (I): R—Si—X (I), wherein R is an organofunctional group, X is hydrolyzable group, and the organofunctional group is aromatic functional group, amino acid functional group or fluorine functional group.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device comprising:
forming a trench in a dielectric layer;
performing a surface treatment process to form a hydrophobic layer on a sidewall surface of the dielectric layer;
forming a metal material in the trench and over the hydrophobic layer; and
performing a planarization process to remove a portion of the metal material, wherein performing the planarization process comprises maintaining a surface temperature of the semiconductor device within a range from about 10 degrees Celsius to about 15 degrees Celsius.

2. The method of claim 1, wherein performing the surface treatment process comprises providing a gas mixture on the sidewall surface of the trench, wherein the gas mixture comprises a silane compound.

3. The method of claim 2, wherein the silane compound comprises trialkoxysilane, dialkoxysilane, monoalkoxy, or dipodal silane.

4. The method of claim 1, further comprising forming a barrier layer on the hydrophobic layer and in the trench.

5. The method of claim 1, wherein the performing the planarization process comprises a chemical mechanical polishing process.

6. The method of claim 1, wherein the hydrophobic layer has a water contact angle in a range from about 50 degrees to about 180 degrees.

7. The method of claim 1, wherein the surface treatment process is operated at a pressure range of about 10-6 torr to about 10-8 torr.

8. A method of manufacturing a semiconductor device comprising:
forming a dielectric layer;
forming a trench in the dielectric layer;
performing a first surface treatment process to form a first hydrophobic layer on a sidewall surface of the dielectric layer;
forming a first metal material in a portion of the trench, wherein the first metal material is formed on the first hydrophobic layer, wherein after forming the first metal material the trench is partially filled with the first metal material forming a recess in the trench over the first metal material; and
after the forming the first metal material, performing a second surface treatment process on the recess to form a second hydrophobic layer on the first hydrophobic layer.

9. The method of claim 8, further comprising forming a second metal material on the second hydrophobic layer and the first metal material.

10. The method of claim 9, further comprising:
performing a third surface treatment process on the recess to form a third hydrophobic layer on the second hydrophobic layer; and forming a third metal material on the third hydrophobic layer and the second metal material.

11. The method of claim 8 wherein the first surface treatment process comprises a silane compound, the silane compound has a formula (I):

wherein R is an organofunctional group, X is a hydrolyzable group, and the organofunctional group is an aromatic functional group, an amino acid functional group or a fluorine functional group.

12. The method of claim 11, wherein the silane compound comprises using trialkoxysilane, monoalkoxysilane or dipoal silane.

13. The method of claim 8, wherein the first surface treatment process is operated at a pressure in a range from about 10-6 torr to about 10-8 torr.

14. The method of claim 8, further comprising:
performing a planarization process to remove a portion of the first metal material; and
maintaining a surface temperature of the semiconductor device within a range from about 10 degrees Celsius to about 15 degrees Celsius during the planarization process.

15. The method of claim 8, wherein the first hydrophobic layer has a water contact angle in a range from about 50 degrees to about 180 degrees.

16. A method of manufacturing a semiconductor device comprising:
forming a dielectric layer;
forming a first trench in the dielectric layer;
forming a first hydrophobic layer on a sidewall surface of the first trench;
forming a first metal material in the first trench and over the first hydrophobic layer;
performing a planarization process to remove a portion of the first metal material, wherein the first hydrophobic layer protects a first metal layer from being damaged during the planarization process;
forming a second hydrophobic layer on a sidewall surface of the first hydrophobic layer; and
forming a second metal material on the second hydrophobic layer and the first metal material.

17. The method of claim 16, further comprising:
forming a gate structure over a fin structure;
forming a gate contact structure over the gate structure; and
forming the first metal layer over the gate contact structure, wherein the dielectric layer is formed over the first metal layer.

18. The method of claim 17, further comprising:
forming a source/drain structure in the fin structure;
forming a source/drain contact structure over the source/drain structure;
forming a source/drain conductive plug structure over the source/drain contact structure;
forming the first metal layer over the source/drain conductive plug;
forming a second trench in the dielectric layer, wherein the second trench is adjacent to the first trench;
forming the first hydrophobic layer in the second trench; and
forming a second via structure over the first hydrophobic layer in the second trench.

19. The method of claim 16, wherein forming the first hydrophobic layer comprises:

providing a gas mixture on the sidewall surface of the first trench, wherein the gas mixture comprises a silane compound and a carrier gas, wherein the silane compound has a formula (I):

R—Si—X    (I), wherein R is an organofunctional group, X is a hydrolyzable group, and the organofunctional group is an aromatic functional group, amino acid functional group or fluorine functional group.

20. The method of claim 16, further comprising forming a third hydrophobic layer on a sidewall surface of the second hydrophobic layer.

* * * * *